(12) United States Patent
Ohmori

(10) Patent No.: US 8,238,150 B2
(45) Date of Patent: Aug. 7, 2012

(54) INFORMATION STORAGE ELEMENT AND METHOD OF WRITING/READING INFORMATION INTO/FROM INFORMATION STORAGE ELEMENT

(75) Inventor: Hiroyuki Ohmori, Kanagawa (JP)

(73) Assignee: Sony Corporation, Tokyo (JP)

( * ) Notice: Subject to any disclaimer, the term of this patent is extended or adjusted under 35 U.S.C. 154(b) by 514 days.

(21) Appl. No.: 12/585,363

(22) Filed: Sep. 14, 2009

(65) Prior Publication Data

US 2010/0097847 A1    Apr. 22, 2010

(30) Foreign Application Priority Data

Oct. 20, 2008    (JP) ................... 2008-269926

(51) Int. Cl.
*G11C 11/14*    (2006.01)
(52) U.S. Cl. ........... 365/171; 365/80; 365/158; 365/173
(58) Field of Classification Search ............ 365/158, 365/171, 173, 80–93; 977/933–935; 257/421, 257/E21.665
See application file for complete search history.

(56) References Cited

U.S. PATENT DOCUMENTS

| 2010/0097848 A1* | 4/2010 | Ohmori | 365/158 |
| 2010/0149863 A1* | 6/2010 | Lee et al. | 365/171 |

FOREIGN PATENT DOCUMENTS

| JP | 2005-123617 | 5/2005 |
| JP | 2006-073930 A | 3/2006 |
| JP | 2006-237183 | 9/2006 |
| JP | 2007-288162 A | 11/2007 |

OTHER PUBLICATIONS

S.S. P. Parkin et al., "Magnetic Domain-Wall Racetrack Memory," Science vol. 320, pp. 190-194, Apr. 11, 2008. www.sciencemag.org.
Japanese Office Action issued Aug. 31, 2010 for corresponding Japanese 2008-269926.

* cited by examiner

*Primary Examiner* — VanThu Nguyen
*Assistant Examiner* — Hien Nguyen
(74) *Attorney, Agent, or Firm* — Rader Fishman & Grauer, PLLC

(57) ABSTRACT

An information storage element includes a strip-shaped ferromagnetic material layer; a first electrode disposed at a first end of the ferromagnetic material layer; and a second electrode disposed at a second end of the ferromagnetic material layer, wherein a current-induced domain wall motion is caused by applying a current between the first electrode and the second electrode, in the ferromagnetic material layer, a magnetization state is written into a magnetization region as information or a magnetization state is read from a magnetization region as information, a magnetization direction in each magnetization region is parallel to a direction of the thickness of the ferromagnetic material layer, and at the time of writing information or reading information, a temperature distribution that monotonically decreases from the second end of the ferromagnetic material layer to the first end thereof is generated in the ferromagnetic material layer.

16 Claims, 14 Drawing Sheets

[STEP-100]

[STEP-110]

[STEP-120]

INFORMATION STORAGE ELEMENT AND METHOD OF WRITING/READING INFORMATION INTO/FROM INFORMATION STORAGE ELEMENT

BACKGROUND OF THE INVENTION

1. Field of the Invention

The present invention relates to an information storage element and a method of writing information into and reading information from the information storage element.

2. Description of the Related Art

In information devices such as computers, currently, a hard disk drive is widely used as an external storage unit. However, since a hard disk drive includes a rotation mechanism, it is difficult to reduce the size thereof and to save electric power. Consequently, a silicon disk drive (solid-state drive (SSD)) including a flash memory has started to be used as an external storage unit for a small device. However, such a silicon disk drive is expensive and the storage capacity thereof is not sufficient. Therefore, a storage unit which has a large storage capacity, which is non-volatile, and into and from which information can be written and read at a high speed has been strongly desired.

As one of such storage units, a current-induced domain wall motion magnetic memory, which is a memory developed from a magnetic memory configured to store information as a magnetization state of a magnetic material, has been devised (refer to, for example, Japanese Unexamined Patent Application Publication Nos. 2005-123617 and 2006-237183). In such a current-induced domain wall motion magnetic memory, a strip-shaped ferromagnetic material layer is divided into a plurality of magnetization regions (magnetic domains), and a current is applied to the ferromagnetic material layer, whereby information is written into or read from the magnetization regions of the ferromagnetic material layer while moving a domain wall, which is a boundary of the magnetization regions.

SUMMARY OF THE INVENTION

Such a current-induced domain wall motion magnetic memory still has a problem in terms of holding of information and a stable motion of a domain wall. In order to easily move a domain wall, the thickness of the ferromagnetic material layer may be reduced or a soft magnetic material may be used as the ferromagnetic material layer. However, such a solution is contrary to stable holding of information. Furthermore, when domain walls are moved a long distance in the ferromagnetic material layer, the distance between domain walls may vary, and thus information errors may readily occur.

Accordingly, it is desirable to provide an information storage element including a domain wall motion magnetic memory in which a stable domain wall motion can be realized and writing, holding, and reading of information can be reliably performed, and a method of writing information into and reading information from the information storage element.

According to an information storage element according to a first embodiment or a second embodiment of the present invention and an information storage element used in a method of writing and reading information according to a first embodiment or a second embodiment of the present invention, there is provided an information storage element including a strip-shaped ferromagnetic material layer (ferromagnetic recording layer); a first electrode disposed at a first end of the ferromagnetic material layer; and a second electrode disposed at a second end of the ferromagnetic material layer, in which a current-induced domain wall motion is caused by applying a current between the first electrode and the second electrode, in the ferromagnetic material layer, a magnetization state is written into a magnetization region as information or a magnetization state is read from a magnetization region as information, and a magnetization direction in each magnetization region is parallel to a direction of the thickness of the ferromagnetic material layer.

In the information storage element according to the first embodiment of the present invention, at the time of writing information or reading information, a temperature distribution that monotonically decreases from the second end of the ferromagnetic material layer to the first end thereof is generated in the ferromagnetic material layer.

In the information storage element according to the second embodiment of the present invention, perpendicular magnetic anisotropy in the ferromagnetic material layer monotonically increases from the second end of the ferromagnetic material layer to the first end thereof.

Furthermore, in the method of writing information into and reading information from the information storage element according to the first embodiment of the present invention (hereinafter referred to as "a method of writing and reading information according to a first embodiment of the present invention"), at the time of writing information or reading information, a temperature distribution that monotonically decreases from the second end of the ferromagnetic material layer to the first end thereof is generated in the ferromagnetic material layer to control a domain wall in the ferromagnetic material layer.

In the method of writing information into and reading information from the information storage element according to the second embodiment of the present invention (hereinafter referred to as "a method of writing and reading information according to a second embodiment of the present invention"), perpendicular magnetic anisotropy in the ferromagnetic material layer of the information storage element monotonically increases from the second end of the ferromagnetic material layer to the first end thereof, and at the time of writing information or reading information, the temperature of the ferromagnetic material layer is increased to control the position of a domain wall in the ferromagnetic material layer.

In the methods of writing and reading information according to the first and second embodiments of the present invention, or in the information storage elements according to the first and second embodiments of the present invention, a magnetization state is written into a magnetization region as information. A method of writing such information depends on the configuration and structure of a third electrode, but examples of the method includes a method in which information is written by spin-injection magnetization reversal due to an application of a current on the basis of a giant magnetoresistance (GMR) effect or a tunnel magnetoresistance (TMR) effect and a method in which information is written on the basis of a magnetic field generated by a current. The magnetization state is read from a magnetization region as information. Examples of a method of reading such information include a method of detecting the level of an electrical resistance value in a ferromagnetic material layer and a method of detecting a direction of a magnetic field in a ferromagnetic material layer.

In general, in the case where a magnetization direction in a magnetization region is parallel to a direction of the thickness of a ferromagnetic material layer, that is, in the case where a magnetization region is perpendicularly magnetized, when the temperature of the ferromagnetic material layer increases to decrease perpendicular magnetic anisotropy, a domain wall readily moves. In contrast, when the temperature of the ferromagnetic material layer decreases to increase perpendicular magnetic anisotropy, a domain wall does not readily move.

In the information storage element and the method of writing and reading information according to the first embodiment of the present invention, at the time of writing information or reading information, a temperature distribution that monotonically decreases from the second end of the ferromagnetic material layer to the first end thereof is generated. It is assumed that when the temperature of the ferromagnetic material layer is lower than $T_0°$ C., a domain wall does not readily move, and when the temperature of the ferromagnetic material layer is equal to or higher than $T_0°$ C., a domain wall readily moves. Here, it is supposed that the temperature of the ferromagnetic material layer at a position distance $L_1$ from the second end of the ferromagnetic material layer is $T_0$. When information is written into the ferromagnetic material layer in this state, an upward magnetization state or a downward magnetization state, which is the written information, is moved toward the first end by a current-induced domain wall motion due to a spin torque generated by supplying a current from the first electrode to the second electrode. When the upward magnetization state or the downward magnetization state passes through the position at the distance $L_1$, the motion of the magnetization state (motion of a domain wall) stops and the magnetization state as information is fixed in a region located beyond the position at the distance $L_1$. Subsequently, it is assumed that, by changing a temperature distribution that monotonically decreases from the second end of the ferromagnetic material layer to the first end thereof, the temperature of the ferromagnetic material layer at a position distance $L_2$ ($<L_1$) from the second end of the ferromagnetic material layer becomes $T_0$. When information is written into the ferromagnetic material layer in this state and a magnetization state passes through the position at the distance $L_2$, a motion of the magnetization state as information (motion of a domain wall) stops and the magnetization state as information is fixed in a region located beyond the position at the distance $L_2$. Thus, a magnetization state as information can be reliably written and fixed at a desired position (region) in the ferromagnetic material layer.

It is assumed that, at the time of reading information, the temperature of the ferromagnetic material layer at the position distance $L_2$ from the second end of the ferromagnetic material layer is $T_0$. The magnetization state as information is moved toward the second end of the ferromagnetic material layer by a current-induced domain wall motion caused by applying a current from the second electrode to the first electrode. However, the magnetization state in a region located beyond the distance $L_2$ does not move. Thus, the information in a region ranging from the second end of the ferromagnetic material layer to a position that is located within the distance $L_2$ can be read. Subsequently, it is assumed that, by changing a temperature distribution that monotonically decreases from the second end of the ferromagnetic material layer to the first end thereof, the temperature of the ferromagnetic material layer at a position distance $L_1$ ($>L_2$) from the second end of the ferromagnetic material layer becomes $T_0$. In this state, the magnetization state as information moves toward the second end of the ferromagnetic material layer. However, the magnetization state in a region located beyond the distance $L_1$ does not move. Thus, the magnetization state as information at a desired position (region) in the ferromagnetic material layer can be reliably read. Note that, at the time of reading information, the stored information is broken. Accordingly, it is necessary that after the completion of reading of the information, information be written or the information be transfer to another information storage element. The method of writing and reading information is so-called a sequential method.

In the information storage element and the method of writing and reading information according to the second embodiment of the present invention, at the time of writing information or reading information, the temperature of the ferromagnetic material layer is increased. Here, it is assumed that a value of perpendicular magnetic anisotropy of the ferromagnetic material layer at a position distance $L_1$ from the second end of the ferromagnetic material layer is represented by $MA_1$, and a value of perpendicular magnetic anisotropy of the ferromagnetic material layer at a position distance $L_2$ ($<L_1$) from the second end of the ferromagnetic material layer is represented by $MA_2$ ($<MA_1$). In addition, in the value $MA_1$ of the perpendicular magnetic anisotropy, it is assumed that when the temperature of the ferromagnetic material layer is equal to or higher than $T_1°$ C., a domain wall readily moves. In the value $MA_2$ of the perpendicular magnetic anisotropy, it is assumed that when the temperature of the ferromagnetic material layer is equal to or higher than $T_2°$ C. ($<T_1$), a domain wall readily moves.

At the time of writing information, the temperature of the ferromagnetic material layer is assumed to be $T_1°$ C. When information is written into the ferromagnetic material layer in this state, a magnetization state as information is moved toward a first end of the ferromagnetic material layer by a current-induced domain wall motion caused by supplying a current from the first electrode to the second electrode. When the magnetization state passes through the position at the distance $L_1$, the motion of the magnetization state as information (motion of a domain wall) stops and the magnetization state as information is fixed in a region located beyond the position at the distance $L_1$. Next, the temperature of the ferromagnetic material layer is decreased to $T_2°$ C. When information is written into the ferromagnetic material layer in this state and a magnetization state passes through the position at the distance $L_2$, a motion of the magnetization state as information stops, and the magnetization state as information is fixed in a region located beyond the position at the distance $L_2$. Thus, a magnetization state as information can be reliably written and fixed at a desired position (region) in the ferromagnetic material layer.

At the time of reading information, the temperature of the ferromagnetic material layer is assumed to be $T_2°$ C. A magnetization state as information is moved toward the second end of the ferromagnetic material layer by a current-induced domain wall motion caused by supplying a current from the second electrode to the first electrode. However, the magnetization state in a region located beyond the distance $L_2$ from the second end of the ferromagnetic material layer does not move. Thus, the information in a region ranging from the second end of the ferromagnetic material layer to a position that is located within the distance $L_2$ can be read. Next, the temperature of the ferromagnetic material layer is increased to $T_1°$ C. In this state, the magnetization state as information moves toward the second end of the ferromagnetic material layer. However, the magnetization state in a region located beyond the distance $L_1$ does not move. Thus, the magnetization state as information at a desired position (region) in the ferromagnetic material layer can be reliably read. Note that, at the time of reading information, the stored information is broken. Accordingly, it is necessary that after the completion of reading of the information, information be written or the information be transfer to another information storage element. The method of writing and reading information is a sequential method.

Accordingly, even when a domain wall moves a long distance in the ferromagnetic material layer, the occurrence of a problem that information errors readily occur can be reliably prevented. As a result, according to the embodiment of the present invention, writing, recording, and reading of information can be reliably performed while stably holding the information and a large amount of information can be recorded in a single continuous magnetic element. Consequently, a compact, lightweight, and inexpensive information storage unit can be realized.

DESCRIPTION OF THE PREFERRED EMBODIMENTS

Figure 1A:
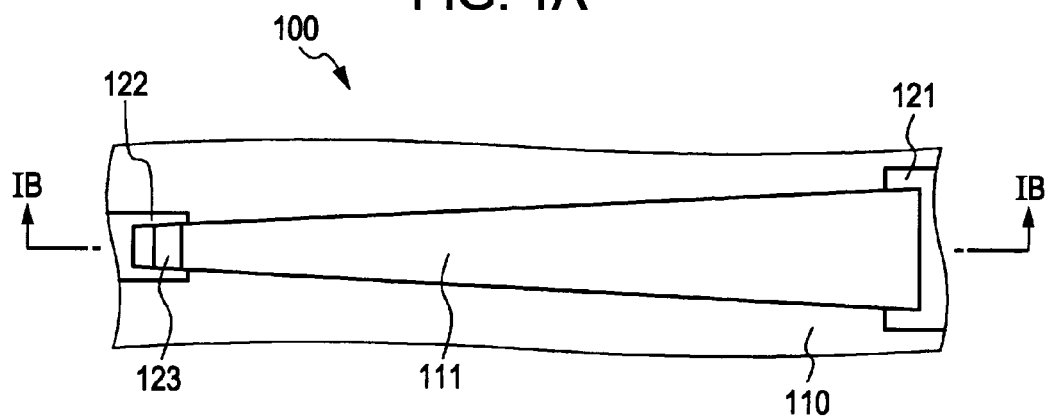
FIG. 1A is a schematic partial plan view of an information storage element of Example 1.

The present invention will now be described with reference to the drawings on the basis of Examples.

[Overall Description about Information Storage Elements and Methods of Writing Information into and Reading Information from the Information Storage Elements according to Embodiments of the Present Invention]

In the information storage element or the method of writing and reading information according to the first embodiment of the present invention, and the information storage element or the method of writing and reading information according to the second embodiment of the present invention, information storage element may further include a third electrode disposed in contact with a part of the ferromagnetic material layer, the third electrode including a non-magnetic film that is in contact with the part of the ferromagnetic material layer and a magnetization reference layer (also referred to as "pinned layer" or "magnetization-pinned layer") disposed on the non-magnetic film, in which a magnetization state may be written into each magnetization region as information by applying a current between the second electrode and the third electrode. In this case, an electrical resistance value in each magnetization region may be read from the third electrode as information by applying a current between the second electrode and the third electrode. The second electrode and the third electrode may be disposed so as to face each other, with the ferromagnetic material layer therebetween. The second electrode and the third electrode may be disposed at the same side of the ferromagnetic material layer or different sides of the ferromagnetic material layer. Furthermore, in the temperature distribution that monotonically decreases from the second end of the ferromagnetic material layer to the first end thereof, an increase in the temperature may be larger in a region closer to the third electrode.

In the methods of writing and reading information according to the first and second embodiments of the present invention, the information storage element may further include a magnetic field detection device adjacent to a part of the ferromagnetic material layer, and a magnetic field generated in each magnetization region may be read as information by the magnetic field detection device. Specific examples of the magnetic field detection device include a coil and wiring that detect a magnetic field. The direction of the magnetic field generated in each magnetization region may be read as information by the coil or wiring used as the magnetic field detection device. Alternatively, as the method of reading information, a method using a photomagnetic effect (Kerr effect) may be employed.

Furthermore, in the information storage element or the method of writing and reading information according to the first embodiment of the present invention, a cross-sectional area of the ferromagnetic material layer when the ferromagnetic material layer is cut along a virtual plane orthogonal to a direction of the axis of the ferromagnetic material layer may vary in the direction of the axis of the ferromagnetic material layer, and, at the time of writing information or reading information, the temperature distribution may be generated in the ferromagnetic material layer by applying a current between the first electrode and the second electrode. For convenience, this configuration is referred to as "a first configuration". Alternatively, a specific resistance value of the ferromagnetic material layer may vary in a direction of the axis of the ferromagnetic material layer, and, at the time of writing information or reading information, the temperature distribution may be generated in the ferromagnetic material layer by applying a current between the first electrode and the second electrode. For convenience, this configuration is referred to as "a second configuration". Alternatively, the information storage element may further include a temperature control device configured to change the temperature of the ferromagnetic material layer in a direction of the axis of the ferromagnetic material layer, the temperature control device being disposed near the ferromagnetic material layer, in which, at the time of writing information or reading information, the temperature distribution may be generated in the ferromagnetic material layer by the temperature control device. For convenience, this configuration is referred to as "a third configuration".

The variation in the cross-sectional area of the ferromagnetic material layer in the direction of the axis of the ferromagnetic material layer (specifically, the variation in which the cross-sectional area gradually increases continuously or stepwise from the second end of the ferromagnetic material layer to the first end thereof) can be obtained by setting the width of the ferromagnetic material layer, setting the thickness of the ferromagnetic material layer, or setting the width and the thickness of the ferromagnetic material layer. The amount of variation in the cross-sectional area in the direction of the axis of the ferromagnetic material layer may be appropriately determined in accordance with the specification of the information storage element. The specific resistance value can be varied by, for example, implanting nitrogen ions or oxygen ions into desired portions or regions of the ferromagnetic material layer. The variation in the specific resistance value (specifically, the variation in which the specific resistance value gradually decreases continuously or stepwise from the second end of the ferromagnetic material layer to the first end thereof) may be appropriately determined in accordance with the specification of the information storage element.

An example of the temperature control device is a heater for heating the ferromagnetic material layer. Such a heater may be disposed near the ferromagnetic material layer. The heater can be constituted by, for example, a patterned high-resistor layer. Examples of the material constituting the high-resistor layer include carbon-based resistor materials such as silicon carbide (SiC) and silicon carbide nitride (SiCN), silicon nitride (SiN)-based materials, semiconductor resistor materials such as amorphous silicon, refractory metal oxides such as ruthenium dioxide ($RuO_2$), tantalum oxide, chromium oxide, and titanium oxide, and refractory metal nitrides such as tantalum nitride. Another example of the temperature control device is a laser beam for heating the ferromagnetic material layer. Alternatively, heat conduction around the ferromagnetic material layer may be changed. That is, the thermal conductivity of a region surrounding the ferromagnetic material layer may be changed. Specifically, for example, a heat sink may be provided. In such an embodiment, the heat sink corresponds to the temperature control device.

In the information storage element or the method of writing and reading information according to the second embodiment of the present invention, the perpendicular magnetic anisotropy may be smaller in a region closer to the third electrode.

In the information storage element or the method of writing and reading information according to the first embodiment of the present invention, the temperature distribution may be generated in the ferromagnetic material layer by Joule heat generated by applying the current between the first electrode and the second electrode. In this case, the value of the current applied between the first electrode and the second electrode may be changed stepwise or continuously.

In the information storage element or the method of writing and reading information according to the second embodiment of the present invention, the temperature of the ferromagnetic material layer may be increased by Joule heat generated by applying the current between the first electrode and the second electrode.

In the information storage element or the method of writing and reading information according to the first embodiment of the present invention, when the number of bits of information to be stored is represented by N, different temperature distributions are generated N times. In the information storage element or the method of writing and reading information according to the second embodiment of the present invention, when the number of bits of information to be stored is represented by N, different temperature increases are generated N times. The temperature distribution or the increase in the temperature can be appropriately determined in accordance with the specification of the information storage element.

It is sufficient that the planar shape of the ferromagnetic material layer may be a strip (stripe) shape. The planar shape of the ferromagnetic material layer may be linear or curved. The ferromagnetic material layer may have a three-dimensional shape such as a "U-character" shape, or a branched shape such as a "Y-character" shape.

As a material constituting the ferromagnetic material layer (ferromagnetic recording layer), a material having a high spin-torque efficiency is preferably used in order to move a domain wall with a small current. Specific examples thereof include alloys in which gadolinium (Gd) is added to an alloy (such as Co—Fe, Co—Fe—Ni, or Ni—Fe) of a ferromagnetic material such as nickel (Ni), iron (Fe), or cobalt (Co). Furthermore, in order to further increase perpendicular magnetic anisotropy, a heavy rare earth element such as terbium (Tb), dysprosium (Dy), or holmium (Ho) may be added to such an alloy, or a film composed of an alloy containing such a heavy rare earth element may be stacked. The crystallinity of the ferromagnetic material layer is optional, and the ferromagnetic material layer may be composed of polycrystals or a single crystal, or may be amorphous. The ferromagnetic material layer may have a single-layer structure, a stacked layer structure in which a plurality of different ferromagnetic material layers are stacked as described above, or a stacked layer structure in which a ferromagnetic material layer and a non-magnetic material layer are stacked.

The ferromagnetic material layer can be formed by a physical vapor deposition (PVD) method such as a sputtering method, an ion-beam deposition method, or a vacuum deposition method or a chemical vapor deposition (CVD) method such as an atomic layer deposition (ALD) method. Pattering of the ferromagnetic material layer can be performed by a reactive ion etching (RIE) method or an ion milling method (ion-beam etching method).

In the information storage element or the method of writing and reading information according to the second embodiment of the present invention, examples of a method of monotonically increasing perpendicular magnetic anisotropy in the ferromagnetic material layer from the second end of the ferromagnetic material layer to the first end thereof include a method of forming a composition distribution by, for example, implanting ions into the ferromagnetic material layer and a method of forming a distribution of the crystallinity of the ferromagnetic material layer by a local heating method using a laser beam or the like.

Each of the first electrode and the second electrode may have a single-layer structure composed of, for example, Cu, Au, Pt, or Ti or a stacked structure including an underlying layer composed of, for example, Cr or Ti and a Cu layer, a Au layer, a Pt layer or the like disposed on the underlying layer. Alternatively, each of the first electrode and the second electrode may have a single-layer structure composed of, for example, W, Ru, or Ta or a stacked structure including a W, Ru, or Ta layer and a Cu, Cr, or Ti layer. These electrodes can be formed by, for example, a PVD method such as a sputtering method.

The third electrode and the ferromagnetic material layer constitute an information recoding structure having a TMR effect or a GMR effect. Here, the information recoding structure having the TMR effect and constituted by a magnetization reference layer, a non-magnetic film, and the ferromagnetic material layer refers to a structure in which the non-magnetic film functioning as a tunnel insulating film is sandwiched between the magnetization reference layer and the ferromagnetic material layer. Examples of the material of the magnetization reference layer included in the third electrode include the above-mentioned materials constituting the ferromagnetic material layer. The magnetization reference layer may have a configuration having a stacked ferri-structure (stacked structure having an antiferromagnetic coupling and also referred to as a synthetic antiferromagnet (SAF)) or a configuration having a magnetostatic coupling structure. The stacked ferri-structure is a structure which has, for example, a three-layer structure of magnetic material layer/ruthenium (Ru) layer/magnetic material layer (specifically, for example, a three-layer structure of CoFe/Ru/CoFe or a three-layer structure of CoFeB/Ru/CoFeB) and in which interlayer exchange coupling between the two magnetic material layers becomes antiferromagnetic or ferromagnetic depending on the thickness of the ruthenium layer. Such a structure has been reported in, for example, S. S. Parkin et al., Physical Review Letters, 7 May, pp. 2304-2307 (1990). A structure in which the interlayer exchange coupling between the two magnetic material layers becomes antiferromagnetic is referred to as "stacked ferri-structure". On the other hand, a structure in which antiferromagnetic coupling is obtained by a leakage magnetic field from an end face of the two magnetic material layers is referred to as "magnetostatic coupling structure". Examples of the material of the non-magnetic film included in the third electrode include insulating materials such as magnesium oxide (MgO), magnesium nitride, aluminum oxides ($AlO_x$), aluminum nitride (AlN), silicon oxide, silicon nitride, $TiO_2$, $Cr_2O_3$, Ge, NiO, $CdO_x$, $HfO_2$, $Ta_2O_5$, BN, and ZnS. On the other hand, examples of the material of the non-magnetic film constituting an information recoding structure having a GMR effect include electrically conductive materials such as Cu, Ru, Cr, Au, Ag, Pt, and Ta and alloys thereof. The non-magnetic film may be composed of any non-metallic material as long as the material has a high electrical conductivity (a resistivity of several hundred $\mu\Omega\cdot cm$ or less). However, preferably, a material that does not readily cause an interface reaction with the ferromagnetic material layer or the magnetization reference layer is appropriately selected as the material of the non-magnetic film.

The non-magnetic film composed of an insulating material is obtained by, for example, oxidizing or nitriding a metal film formed by a sputtering method. More specifically, in the case where an aluminum oxide ($AlO_x$) or magnesium oxide (MgO) is used as the insulating material constituting the non-magnetic film, examples of the method of forming the non-magnetic film include a method of oxidizing in the atmosphere aluminum or magnesium deposited by a sputtering method, a method of plasma-oxidizing aluminum or magnesium deposited by a sputtering method, a method of oxidizing by ICP plasma aluminum or magnesium deposited by a sputtering method, a method of naturally oxidizing in oxygen aluminum or magnesium deposited by a sputtering method, a method of oxidizing with oxygen radicals aluminum or magnesium deposited by a sputtering method, a method of naturally oxidizing aluminum or magnesium in oxygen while irradiating ultraviolet rays, the aluminum or magnesium being deposited by a sputtering method, a method of depositing aluminum or magnesium by a reactive sputtering method, and a method of depositing an aluminum oxide ($AlO_x$) or magnesium oxide (MgO) by a sputtering method.

EXAMPLE 1

Example 1 relates to an information storage element according to the first embodiment of the present invention and a method of writing information into and reading information from the information storage element according to the first embodiment of the present invention. More specifically, Example 1 relates to the first configuration.

Figure 1B:
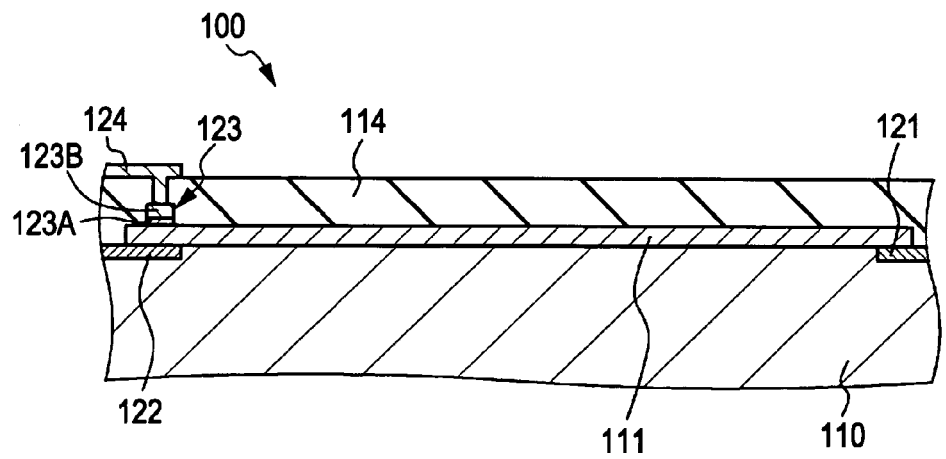
FIG. 1B is a schematic partial cross-sectional view of the information storage element of Example 1.

FIG. 1A is a schematic partial plan view of an information storage element of Example 1, and FIG. 1B is a schematic partial cross-sectional view taken along line IB-IB of FIG. 1A. As shown in FIGS. 1A and 1B, an information storage element 100 of Example 1 includes a strip-shaped ferromagnetic material layer (ferromagnetic recording layer) 111. A first electrode 121 is provided at an end (hereinafter referred to as "first end") of the ferromagnetic material layer 111, and a second electrode 122 is provided at another end (hereinafter referred to as "second end") of the ferromagnetic material layer 111. In the information storage element 100 of Example 1, a current-induced domain wall motion is caused by applying a current between the first electrode 121 and the second electrode 122 occurs. Here, the current applied between the first electrode 121 and the second electrode 122 is referred to as "domain wall-moving current". In the ferromagnetic material layer 111, a magnetization state is written as information into a magnetization region 112 or a magnetization state is read as information from the magnetization region 112. Furthermore, the magnetization direction in each magnetization region 112 is parallel to a direction of the thickness of the ferromagnetic material layer 111. Reference numeral 113 indicates a domain wall which is a boundary (interface) between magnetization regions 112. In FIG. 1A, an interlayer insulating layer 114 is omitted. Reference numeral 124 indicates a wiring provided on the interlayer insulating layer 114 and connected to a third electrode 123. In the information storage element 100 shown in FIGS. 1A and 1B, the first electrode 121 and the second electrode 122 are provided under the ferromagnetic material layer 111, and the third electrode 123 is provided on the ferromagnetic material layer 111. Alternatively, the first electrode 121 and the second electrode 122 may be provided on the ferromagnetic material layer 111, and the third electrode 123 may be provided under the ferromagnetic material layer 111.

The information storage element 100 of Example 1 further includes the third electrode 123 provided in contact with a part of the ferromagnetic material layer 111. The third electrode 123 is disposed so as to face the second electrode 122 with the ferromagnetic material layer 111 therebetween. The third electrode 123 includes a non-magnetic film 123A that is in contact with the part of the ferromagnetic material layer 111 and a magnetization reference layer 123B disposed on the non-magnetic film 123A. The magnetization reference layer 123B functions as a standard magnetization layer for determining a direction of magnetization to be recorded in the magnetization regions 112. By applying a current between the second electrode 122 and the third electrode 123, a magnetization state is written into each magnetization region 112. Also, by applying a current between the second electrode 122 and the third electrode 123, an electrical resistance value (level of the electrical resistance value) in each magnetization region 112 is read from the third electrode 123 as information. The third electrode 123 and the ferromagnetic material layer 111 constitute an information recoding structure having a TMR effect. Magnetization regions 112 are formed by a spin-injection magnetization reversal due to a current to form a domain wall 113, thus writing information into the ferromagnetic material layer 111. Specifically, in the ferromagnetic material layer 111, the magnetization direction thereof is changed to a direction parallel or antiparallel to the magnetization direction of the magnetization reference layer 123B in accordance with the direction in which the current flows.

In Example 1, at the time of writing information or reading information, a temperature distribution that monotonically decreases from the second end of the ferromagnetic material layer 111 to the first end thereof is generated in the ferromagnetic material layer 111. Accordingly, the position of the domain wall 113 in the ferromagnetic material layer 111 is controlled. Specifically, the cross-sectional area of the ferromagnetic material layer 111 when the ferromagnetic material layer 111 is cut along a virtual plane orthogonal to a direction of the axis of the ferromagnetic material layer 111 varies in a direction of the axis of the ferromagnetic material layer 111. More specifically, the cross-sectional area of the ferromagnetic material layer 111 varies so as to gradually and continuously increase from the second end to the first end. That is, the cross-sectional area of the ferromagnetic material layer 111 increases towards the first electrode 121. According to this structure, at the time of writing information or reading information, a temperature distribution can be generated in the ferromagnetic material layer 111 by applying a current between the first electrode 121 and the second electrode 122 at the time of writing information or reading information. Specifically, this structure can form a state in which the temperature of the ferromagnetic material layer 111 decreases toward the first electrode 121.

Figure 5:
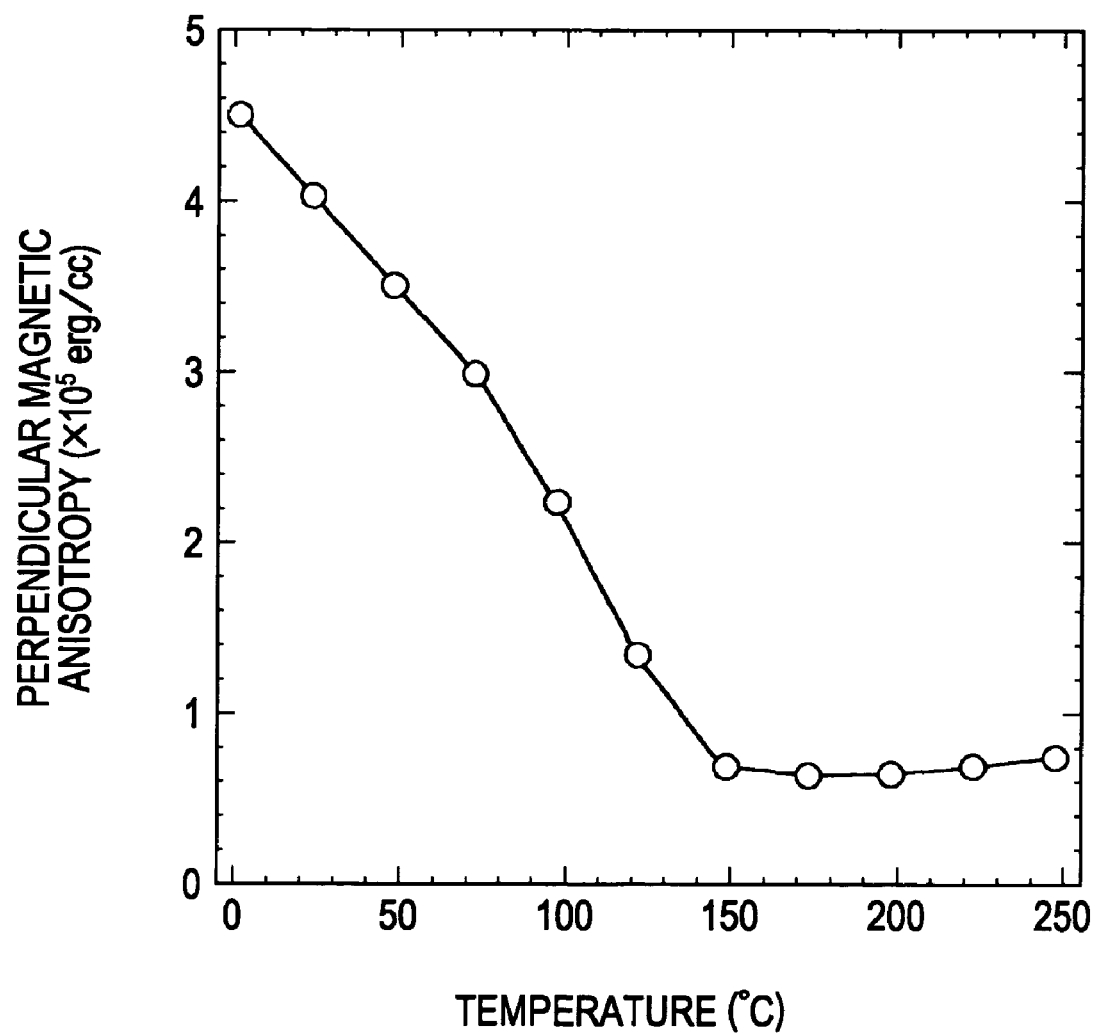
FIG. 5 is a graph showing the relationship between perpendicular magnetic anisotropy and the temperature in a stacked structure including a CoFeCrB alloy layer and a GdFeCo alloy layer.

In Example 1, the strip-shaped ferromagnetic material layer 111 has a stacked structure including a Ta underlying layer (thickness: 2 nm), a TbCo alloy layer (thickness: 2 nm), a GdFeCo alloy layer (thickness: 8 nm), and a CoFeCrB alloy layer (thickness: 2 nm). The width of the ferromagnetic material layer 111 gradually changes from the second electrode 122 side to the first electrode 121 side, specifically, from 0.10 µm to 0.15 µm. The distance between the first electrode 121 and the second electrode 122 is 1.3 µm. An electrical resistance value of the ferromagnetic material layer 111 between the first electrode 121 and the second electrode 122 is 820Ω. FIG. 5 shows the relationship between perpendicular magnetic anisotropy and the temperature in a stacked structure including a CoFeCrB alloy layer and a GdFeCo alloy layer. The perpendicular magnetic anisotropy decreases in the temperature range of lower than 150° C. and becomes substantially constant at temperatures equal to or higher than 150° C. The non-magnetic film 123A included in the third electrode 123 is composed of a MgO layer having a thickness of 0.8 nm. The magnetization reference layer 123B included in the third electrode 123 is composed of a stacked film including a CoFeB alloy layer (thickness: 1 nm) and a TbCo alloy layer (thickness: 20 nm). Each of the first electrode 121 and the second electrode 122 is composed of a titanium layer. For example, the first electrode 121 is connected to a driving power supply (not shown), and the second electrode 122 is connected to the ground. The third electrode 123 and the ferromagnetic material layer 111 may constitute an information recoding structure having a GMR effect. In such a case, the non-magnetic film 123A may be composed of, for example, Cu.

A method of writing information into and reading information from the information storage element of Example 1 will now be described with reference to FIGS. 2A to 2E, FIGS. 3A to 3E, and FIGS. 4A to 4E, all of which are conceptual views of the information storage element 100. The method of writing and reading information in Example 1 is so-called a sequential method.

In FIGS. 2A to 2E, FIGS. 3A to 3E, and FIGS. 4A to 4E and FIGS. 11A to 11E, FIGS. 12A to 12E, and FIGS. 13A to 13E described bellow, the arrows drawn inside the ferromagnetic material layer 111 indicate directions of magnetization. For convenience, it is assumed that an upward arrow represents information "0", and a downward arrow represents information "1". The arrow drawn inside the third electrode 123 indicates a direction of magnetization in the magnetization reference layer 123B. When a current is supplied from the third electrode 123 to the second electrode 122, information "0" (an upward arrow) is written into a portion of the ferromagnetic material layer 111, the portion facing the third electrode 123. On the other hand, when a current is supplied from the second electrode 122 to the third electrode 123, information "1" (a downward arrow) is written into the portion of the ferromagnetic material layer 111 facing the third electrode 123. It is assumed that when the temperature of the ferromagnetic material layer 111 is lower than $T_0$° C., a domain wall does not readily move, and when the temperature of the ferromagnetic material layer 111 is equal to or higher than $T_0$° C., a domain wall readily moves.

Figure 2A:
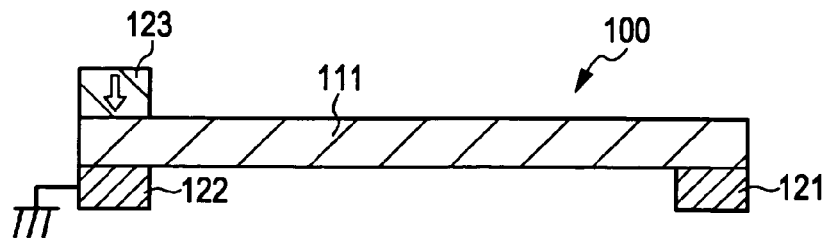
FIGS. 2A, 2B, 2C, and 2E are conceptual views of an information storage element illustrating a method of writing information into and reading information from the information storage element of Example 1.

First, it is supposed that, in the state shown in FIG. 2A, information "0" is written into the ferromagnetic material layer 111 as a first bit. In the state shown in FIG. 2A or in FIG. 11A described below, previous information may be left in the ferromagnetic material layer 111 or 511, but such information is not shown in the figure. A direction of the magnetization of the ferromagnetic material layer 111 or 511 can be initialized by applying a magnetic field from the outside to the ferromagnetic material layer 111 or 511.

Figure 2B:
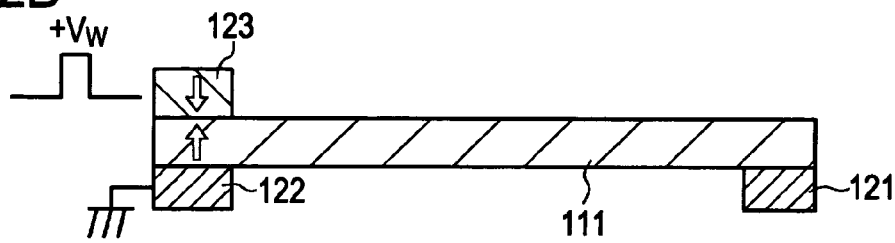

In this case, as shown in FIG. 2B, by applying a voltage $+V_w$ to the third electrode 123, a current is supplied from the third electrode 123 to the second electrode 122. Accordingly, information "0" (upward arrow) is written into the portion of the ferromagnetic material layer 111 facing the third electrode 123.

Figure 2C:
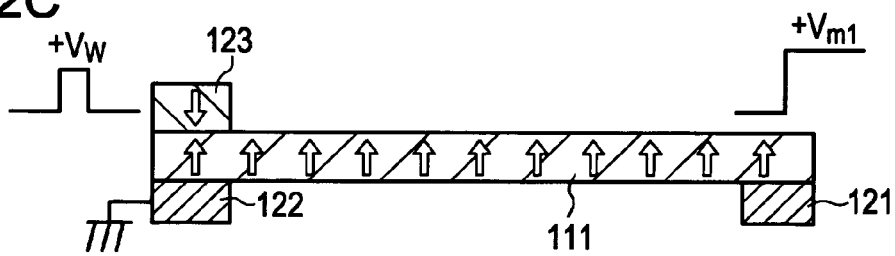
Figure 2D:
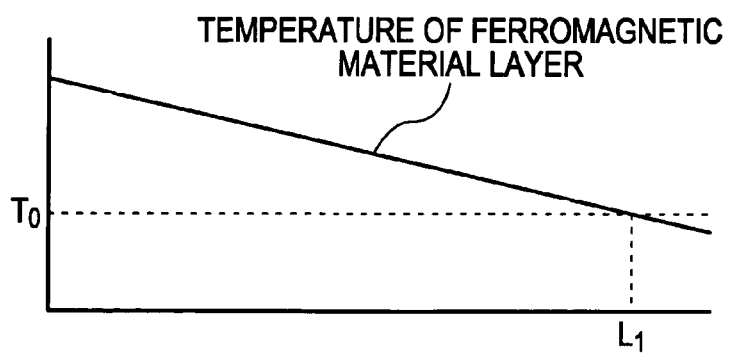
FIG. 2D is a graph that schematically shows a temperature distribution of a ferromagnetic material layer.
Figure 2E:
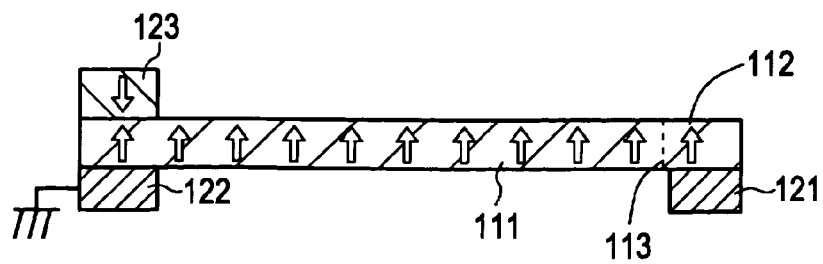

At the same time or immediately after the above application of the voltage, as shown in FIG. 2C, by applying a voltage $+V_{m1}$ to the first electrode 121, a domain wall-moving current is supplied from the first electrode 121 to the second electrode 122. Consequently, Joule heat is generated inside the ferromagnetic material layer 111, and a temperature distribution in which the temperature is high at the second electrode 122 side and is low at the first electrode 121 side is generated in the ferromagnetic material layer 111 by the generated Joule heat (see FIG. 2D). Note that the temperature distribution is generated so that the temperature of the ferromagnetic material layer 111 at a position distance $L_1$ from the second electrode 122 is $T_0$. In addition, by supplying the domain wall-moving current from the first electrode 121 to the second electrode 122, a current-induced domain wall motion occurs. Specifically, the magnetization state moves (propagates) from the left to the right. That is, a domain wall moves to the right. When the domain wall passes through the position at the distance $L_1$, the motion of the domain wall stops. The application of the voltages to the first electrode 121 and the third electrode 123 is then temporarily stopped (see FIG. 2E). Thus, information "0" is written into a region of the ferromagnetic material layer 111, the region being located beyond the position at the distance $L_1$ from the second electrode 122.

Figure 3A:
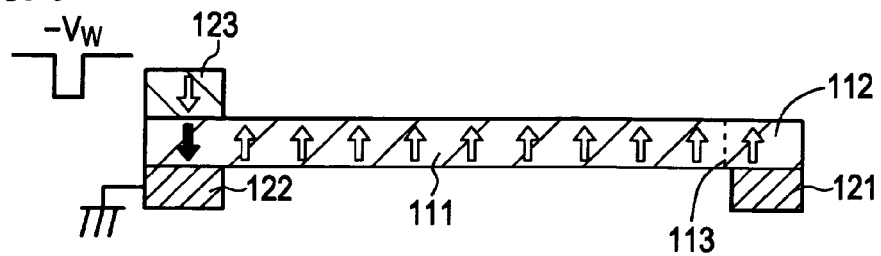
FIGS. 3A, 3B, 3D, and 3E are continuous from FIG. 2E and conceptual views of the information storage element illustrating the method of writing information into and reading information from the information storage element of Example 1.

Next, it is supposed that information "1" is written into the ferromagnetic material layer 111. In this case, as shown in FIG. 3A, by applying a voltage $-V_w$ to the third electrode 123, a current is supplied from the second electrode 122 to the third electrode 123. Accordingly, information "1" (downward arrow) is written into the portion of the ferromagnetic material layer 111 facing the third electrode 123.

Figure 3B:
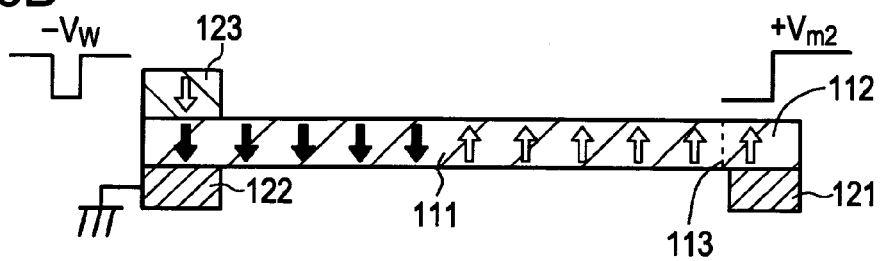
Figure 3C:
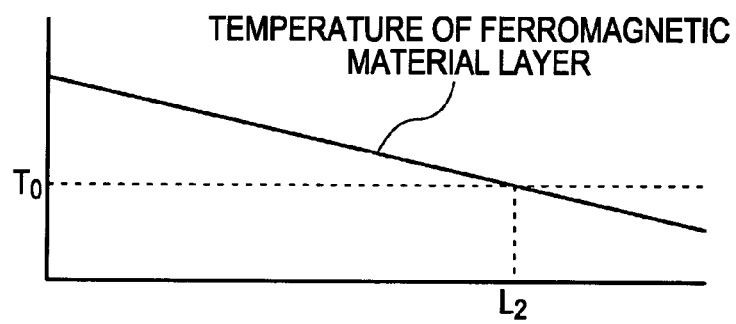
FIG. 3C is a graph that schematically shows a temperature distribution of the ferromagnetic material layer.
Figure 3D:
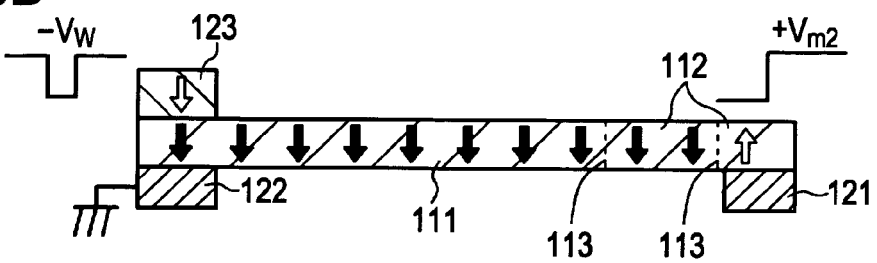
Figure 3E:
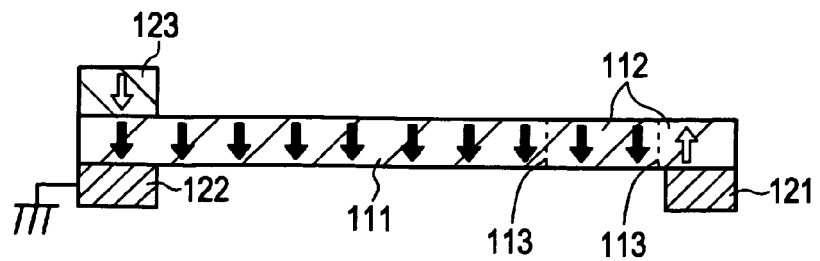

At the same time or immediately after the above application of the voltage, as shown in FIG. 3B, by applying a voltage $+V_{m2}$ $(<+V_{m1})$ to the first electrode 121, a domain wall-moving current is supplied from the first electrode 121 to the second electrode 122. Consequently, as in the case described above, a temperature distribution in which the temperature is high at the second electrode 122 side and is low at the first electrode 121 side is generated in the ferromagnetic material layer 111 by the generated Joule heat. In this step, the temperature distribution is generated so that the temperature of the ferromagnetic material layer 111 at a position distance $L_2$ $(<L_1)$ from the second electrode 122 is $T_0$ (see FIG. 3C). In addition, a current-induced domain wall motion occurs. Specifically, the magnetization state moves (propagates) from the left to the right (see FIG. 3B). That is, a domain wall moves to the right. When the domain wall passes through the position at the distance $L_2$, the motion of the domain wall stops (see FIG. 3D). The application of the voltages to the first electrode 121 and the third electrode 123 is then temporarily stopped (see FIG. 3E). Thus, information "1" is written into a region of the ferromagnetic material layer 111, the region being located beyond the position at the distance $L_2$ from the second electrode 122. That is, in this state, two pieces of information (0, 1) are written in the ferromagnetic material layer 111.

Figure 4A:
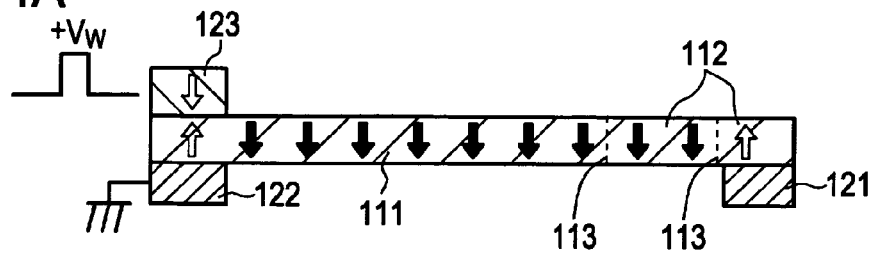
FIGS. 4A, 4B, 4D, and 4E are continuous from FIG. 3E and conceptual views of the information storage element illustrating the method of writing information into and reading information from the information storage element of Example 1.

Next, it is supposed that information "0" is written into the ferromagnetic material layer 111. In this case, as shown in FIG. 4A, by applying a voltage $+V_w$ to the third electrode 123, a current is supplied from the third electrode 123 to the second electrode 122. Accordingly, information "0" (upward arrow) is written into the portion of the ferromagnetic material layer 111 facing the third electrode 123.

Figure 4B:
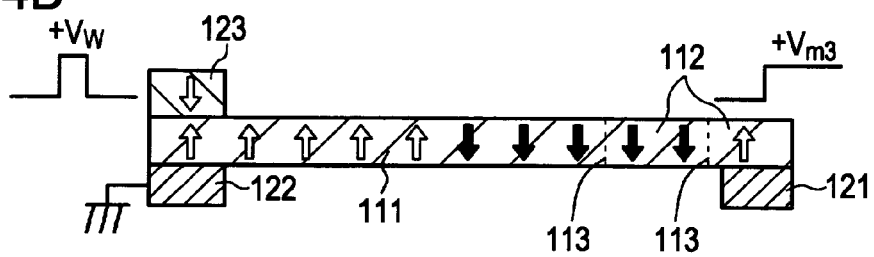
Figure 4C:
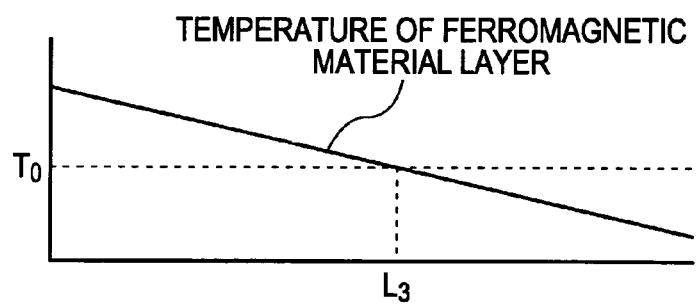
FIG. 4C is a graph that schematically shows a temperature distribution of the ferromagnetic material layer.
Figure 4D:
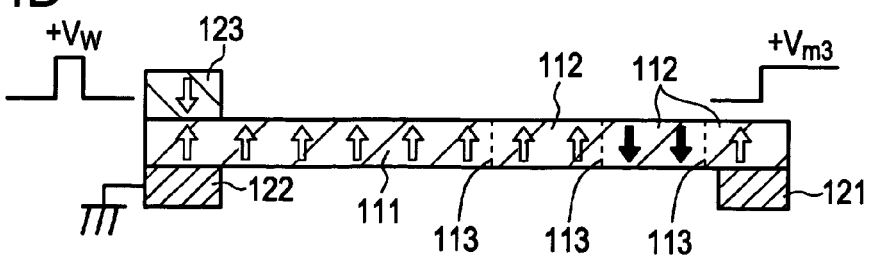
Figure 4E:
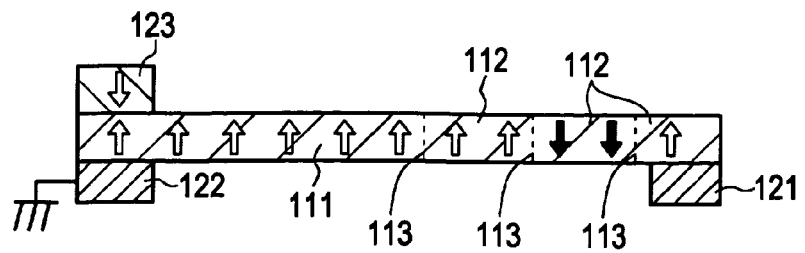

At the same time or immediately after the above application of the voltage, as shown in FIG. 4B, by applying a voltage $+V_{m3}$ $(<+V_{m2})$ to the first electrode 121, a domain wall-moving current is supplied from the first electrode 121 to the second electrode 122. Consequently, as in the case described above, a temperature distribution in which the temperature is high at the second electrode 122 side and is low at the first electrode 121 side is generated in the ferromagnetic material layer 111 by the generated Joule heat. In this step, the temperature distribution is generated so that the temperature of the ferromagnetic material layer 111 at a position distance $L_3$ $(<L_2)$ from the second electrode 122 is $T_0$ (see FIG. 4C). In addition, a current-induced domain wall motion occurs. Specifically, the magnetization state moves (propagates) from the left to the right (see FIG. 4B). That is, a domain wall moves to the right. When the domain wall passes through the position at the distance $L_3$, the motion of the domain wall stops (see FIG. 4D). The application of the voltages to the first electrode 121 and the third electrode 123 is then temporarily stopped (see FIG. 4E). Thus, information "0" is written into a region of the ferromagnetic material layer 111, the region being located beyond the position at the distance $L_3$ from the second electrode 122. That is, in this state, three pieces of information (0, 1, 0) are written in the ferromagnetic material layer 111.

Information may be sequentially written into the ferromagnetic material layer 111 by controlling the value of the domain wall-moving current while moving the domain walls 113 by supplying the domain wall-moving current from the first electrode 121 to the second electrode 122.

By successively repeating such an operation N times in total, information of N bits can be written into the ferromagnetic material layer 111.

When information written in the ferromagnetic material layer 111 is read, a domain wall-moving current is supplied from the second electrode 122 to the first electrode 121. Consequently, Joule heat is generated, thereby generating a temperature distribution in the ferromagnetic material layer 111. Note that the domain wall-moving current is supplied so that the temperature of the ferromagnetic material layer at a position distance $L_3$ from the second end of the ferromagnetic material layer is $T_0$. In addition, a domain wall 113 moves toward the second end of the ferromagnetic material layer 111. However, the magnetization state in a region located beyond the distance $L_3$ does not move. Subsequently, a current is supplied from the third electrode 123 to the second electrode 122 to examine the level of the electrical resistance value of a magnetization region 112. Thus, whether the written information is "0" or "1" can be determined. Here, when the magnetization direction of the ferromagnetic material layer 111 is the same as that of the magnetization reference layer 123B, the electrical resistance is low. When the magnetization direction of the ferromagnetic material layer 111 is antiparallel to that of the magnetization reference layer 123B, the electrical resistance is high. Thus, the information in a region ranging from the second end of the ferromagnetic material layer 111 to a position that is located within the distance $L_3$ can be read. Next, the value of the domain wall-moving current supplied from the second electrode 122 to the first electrode 121 is increased. It is assumed that, as a result, the temperature of the ferromagnetic material layer at a position distance $L_2$ $(>L_3)$ from the second end of the ferromagnetic material layer becomes $T_0$. In this state, the magnetization state as information moves toward the second end of the ferromagnetic material layer 111. However, the magnetization state in a region located beyond the distance $L_2$ does not move. Furthermore, the value of the domain wall-moving current supplied from the second electrode 122 to the first electrode 121 is increased. It is assumed that, as a result, the temperature of the ferromagnetic material layer at a position distance $L_1$ $(>L_2)$ from the second end of the ferromagnetic material layer becomes $T_0$. In this state, the magnetization state as information moves toward the second end of the ferromagnetic material layer 111. However, the magnetization state in a region located beyond the distance $L_1$ does not move. Thus, the magnetization state as information at a desired position (region) in the ferromagnetic material layer can be reliably read.

Figure 6:
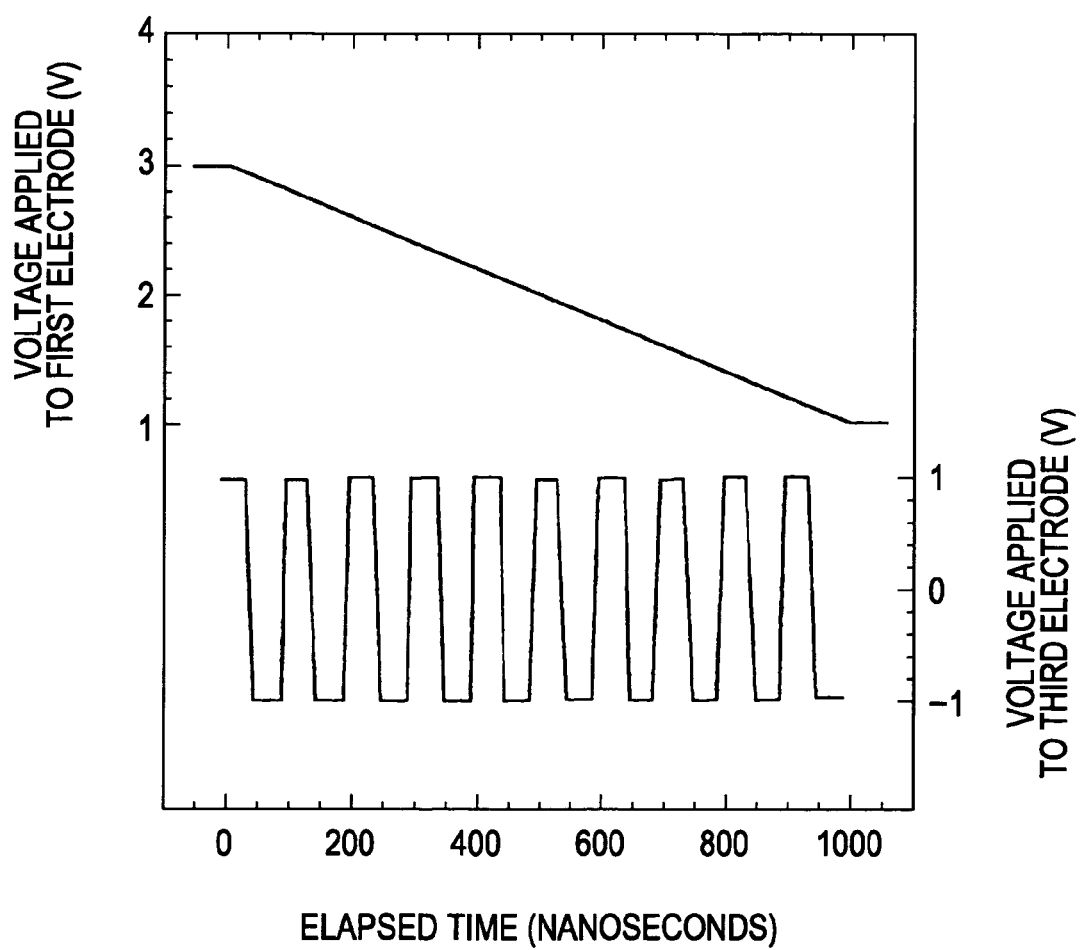
FIG. 6 is a graph showing patterns of voltages applied to a first electrode and a third electrode of the information storage element of Example 1.
Figure 7:
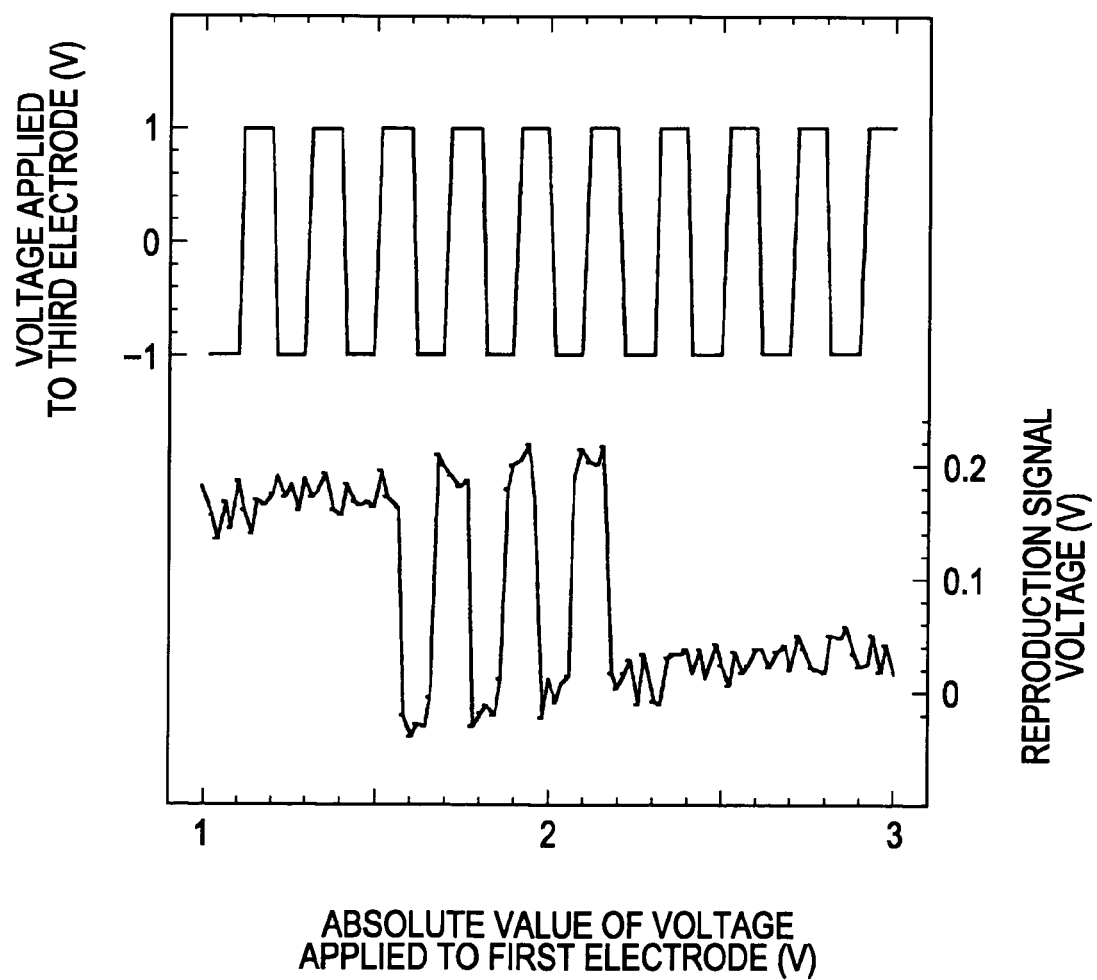
FIG. 7 is a graph showing results when a change in the voltage output from the third electrode of the information storage element of Example 1 was measured as a reproduction signal voltage.

A voltage $+V_m$ shown in FIG. 6 was applied to the first electrode 121 of the information storage element of Example 1. The voltage $+V_m$ was deceased from 3.0 volts to 1.0 volt with time. In addition, a voltage $+V_m$ $(=1.0$ volt$)$ and a voltage −V$_m$ (=−1.0 volt) that are shown in FIG. 6 were alternately applied to the third electrode 123. Thus, information was written into the ferromagnetic material layer 111 of the information storage element. Subsequently, the information written in the ferromagnetic material layer 111 of the information storage element was read. Specifically, a voltage −V$_m$ was applied to the first electrode 121. The voltage −V$_m$ was changed from −1.0 volt to −3.0 volts with time. A change in the voltage output from the third electrode 123 when a constant current of 0.1 milliamperes was applied to the third electrode 123 was measured as a reproduction signal voltage. The results are shown in FIG. 7. FIG. 7 shows the relationship between the reproduction signal voltage at the time of reading information and the absolute value of the voltage applied to the first electrode 121. FIG. 7 also shows the voltage applied to the third electrode 123 at the time of writing information. It was confirmed that when a voltage in the range of 1.5 to 2.2 volts was applied to the first electrode 121, writing and reading of information were performed. Accordingly, a larger amount of information can be stored in the ferromagnetic material layer 111 by optimizing the voltage applied to the first electrode 121, the dimension of the ferromagnetic material layer 111 etc. to realize a high-density recording.

Figure 8A:
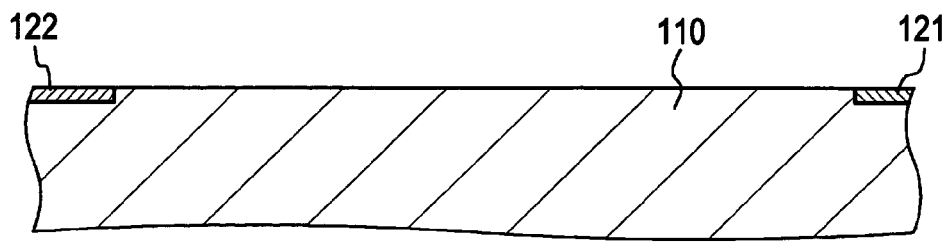
FIGS. 8A to 8C are schematic partial cross-sectional views of a substrate etc. illustrating a method of producing the information storage element of Example 1.
Figure 8B:
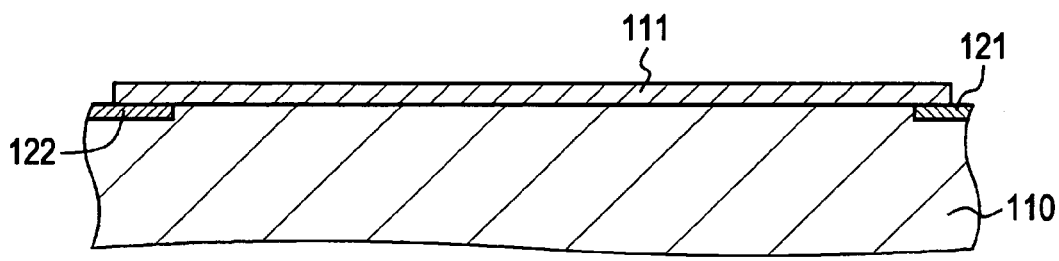
Figure 8C:
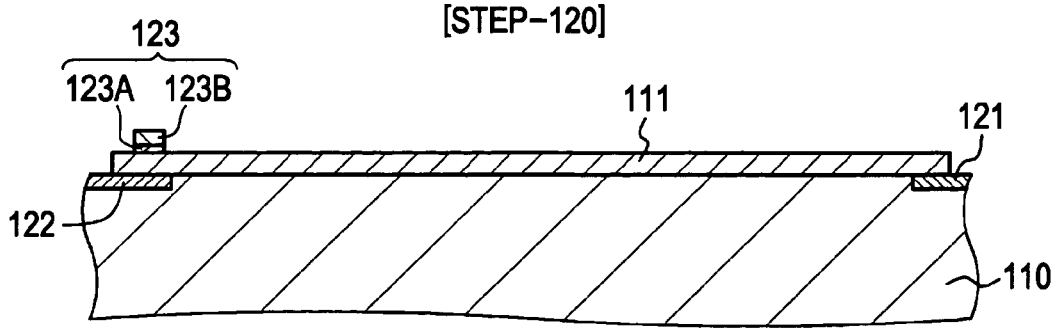

The outline of a method of producing the information storage element 100 of Example 1 will now be described with reference to FIGS. 8A to 8C, which are schematic partial cross-sectional views of a substrate etc.

[Step-100]

First, a first electrode 121 and a second electrode 122 are formed in a substrate 110 composed of a silicon semiconductor substrate. The first electrode 121 and the second electrode 122 may be formed on the substrate 110. However, preferably, a difference in level between the substrate 110 and the first electrode 121 and between the substrate 110 and the second electrode 122 is small so as not to inhibit a motion of a domain wall 113. For this purpose, it is desirable to form the first electrode 121 and the second electrode 122 embedded in the substrate 110. Specifically, trenches are formed in the substrate 110 by a lithography technique and an etching technique. Subsequently, a Ti layer is formed over the entire surface of the substrate 110 by a sputtering method. Subsequently, the Ti layer disposed on the surface of the substrate 110 is removed by, for example, a CMP method, thus leaving the first electrode 121 and the second electrode 122 in the trenches. Thus, as shown in FIG. 8A, the first electrode 121 and the second electrode 122 can be formed in the substrate 110. The first electrode 121 is connected to a driving power supply (not shown) via a wiring (not shown) provided on the substrate 110. The second electrode 122 is connected to the ground via a wiring (not shown) provided on the substrate 110.

[Step-110]

Next, a ferromagnetic material layer is formed over the entire surface of the substrate 110 by a sputtering method. The ferromagnetic material layer is then patterned to form a strip-shaped ferromagnetic material layer 111 (see FIG. 8B). The patterning of the ferromagnetic material layer 111 can be performed by an ion milling method, a reactive etching method, or the like. Alternatively, a lift-off method may be employed.

[Step-120]

Subsequently, a third electrode 123 is formed. Specifically, a non-magnetic film 123A is formed over the entire surface by a sputtering method and an oxidation method, and a magnetization reference layer 123B is further formed by a sputtering method. The non-magnetic film 123A and the magnetization reference layer 123B are then patterned by an ion milling method, a reactive etching method, or the like (see FIG. 8C).

[Step-130]

Subsequently, an interlayer insulating layer 114 composed of an insulating material is formed over the entire surface by, for example, a CVD method. An opening is then formed in a portion of the interlayer insulating layer 114, the portion being located on the third electrode 123. A wiring 124 is then formed on the interlayer insulating layer 114 including the inside of the opening. Thus, the information storage element 100 of Example 1 shown in FIGS. 1A and 1B can be produced. Examples of the material constituting the interlayer insulating layer 114 include SiO$_x$ materials (materials constituting a silicon oxide film) such as SiO$_2$, non-doped silicate glass (NSG), boron phosphorus silicate glass (BPSG), PSG, BSG, AsSG, SbSG, and spin-on-glass (SOG); SiN; SiON; SiOC; SiOF; SiCN; low-dielectric constant insulating materials (such as fluorocarbons, cycloperfluorocarbon polymers, benzocyclobutene, cyclic fluorocarbon resins, polytetrafluoroethylene, amorphous tetrafluoroethylene, fluorinated aryl ethers, fluorinated polyimides, amorphous carbon, organic SOG, parylenes, and fluorinated fullerenes); polyimide resins; fluorocarbon resins; Silk (trademark, a coat-type low-dielectric constant interlayer insulating film material, manufactured by The Dow Chemical Co.) and Flare (trademark, a polyallyl ether (PAE) manufactured by Honeywell Electronic Materials Co.).

According to the information storage element 100 of Example 1, even when a domain wall 113 moves a long distance in the ferromagnetic material layer 111, the occurrence of a problem that information errors readily occur can be reliably prevented. Therefore, writing, recording, and reading of information can be reliably performed while stably holding the information and a large amount of information can be recorded in a single continuous magnetic element. Consequently, a compact, lightweight, and inexpensive information storage unit can be realized.

EXAMPLE 2

Figure 9A:
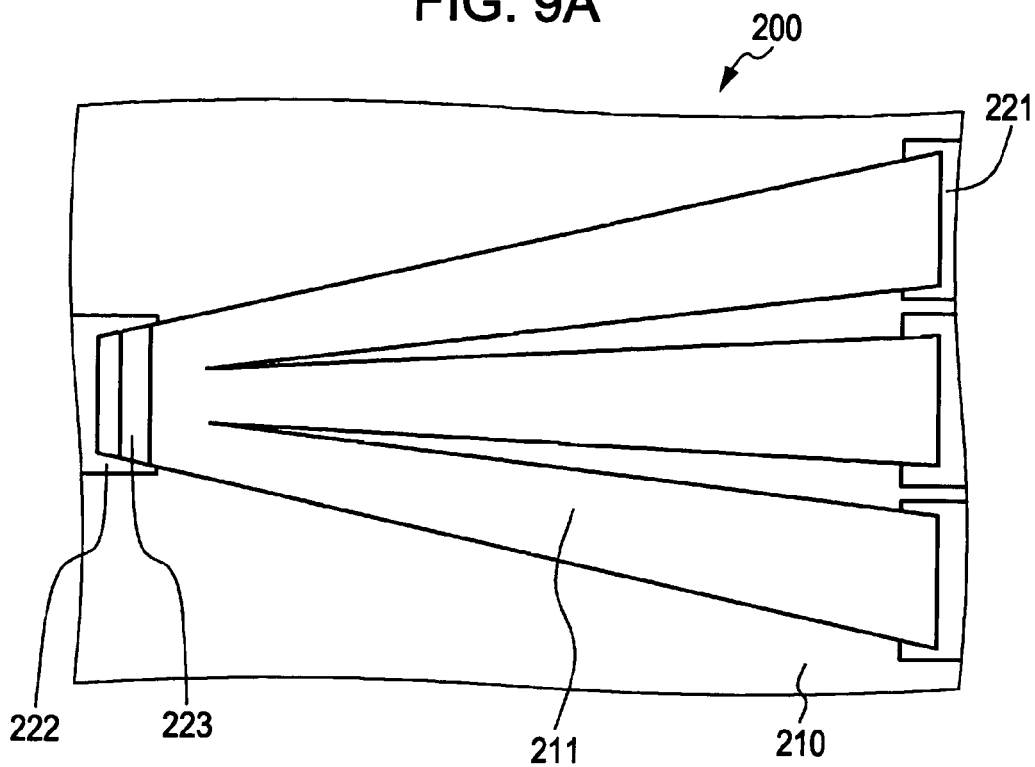
FIGS. 9A and 9B are schematic partial plan views of an information storage element of Example 2.
Figure 9B:
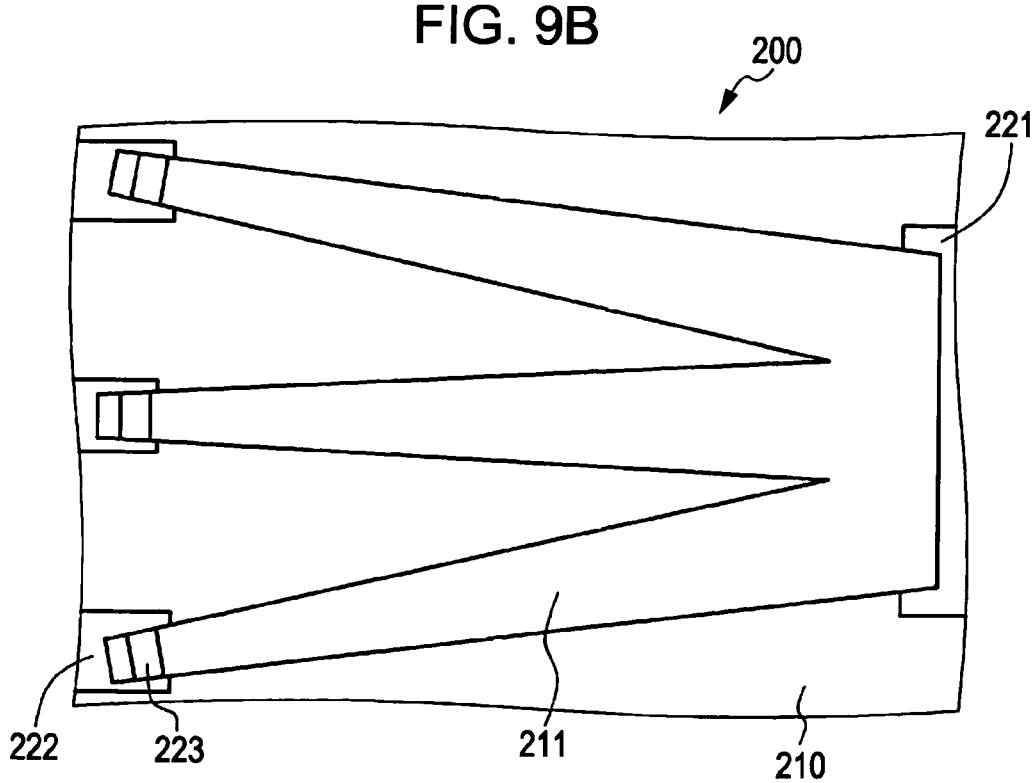

Example 2 is a modification of Example 1. FIGS. 9A and 9B are schematic partial plan views of information storage elements 200 of Example 2. In the information storage elements 200 shown in FIG. 9A, the three information storage elements 200 share a second electrode 222. On the other hand, in the information storage elements 200 shown in FIG. 9B, the three information storage elements 200 share a first electrode 221. The configuration and the structure of the information storage elements 200 of Example 2 can be the same as those of the information storage element 100 of Example 1, and thus a detailed description thereof is omitted. In the information storage elements 200 of Example 2 and information storage elements of Examples described below, components indicated by reference numerals having the same last two digits as those of components constituting the information storage element 100 of Example 1 are the same as the corresponding components of the information storage element 100 of Example 1.

EXAMPLE 3

Example 3 is also a modification of Example 1, but relates to the second configuration. In an information storage element of Example 3, a specific resistance value of a ferromagnetic material layer (ferromagnetic recording layer) varies in a direction of the axis of the ferromagnetic material layer. Specifically, the specific resistance value of the ferromagnetic material layer gradually decreases in a stepwise manner from a second end of the ferromagnetic material layer to a first end thereof. Accordingly, at the time of writing information or reading information, a temperature distribution can be generated by applying a current between a first electrode and a second electrode. The specific resistance value can be varied by, for example, implanting nitrogen ions or oxygen ions into desired portions or regions of the ferromagnetic material layer. The configuration and the structure of the information storage element of Example 3 can be the same as those of the information storage element 100 of Example 1, and thus a detailed description thereof is omitted.

In Example 3, when a domain wall-moving current is supplied from the first electrode to the second electrode or when a domain wall-moving current is supplied from the second electrode to the first electrode, Joule heat is generated inside the ferromagnetic material layer. Consequently, a temperature distribution in which the temperature is high at the second electrode side and is low at the first electrode side is generated in the ferromagnetic material layer by the generated Joule heat. A method of writing information into and reading information from the information storage element of Example 3 can be substantially the same as the method of writing information into and reading information from the information storage element of Example 1, and thus a detailed description thereof is omitted.

In Example 3, as in the description in Example 1, the cross-sectional area of the ferromagnetic material layer may be varied. In addition, the configuration of the information storage element described in Example 2 may be applied to the information storage element of Example 3.

EXAMPLE 4

Figure 10:
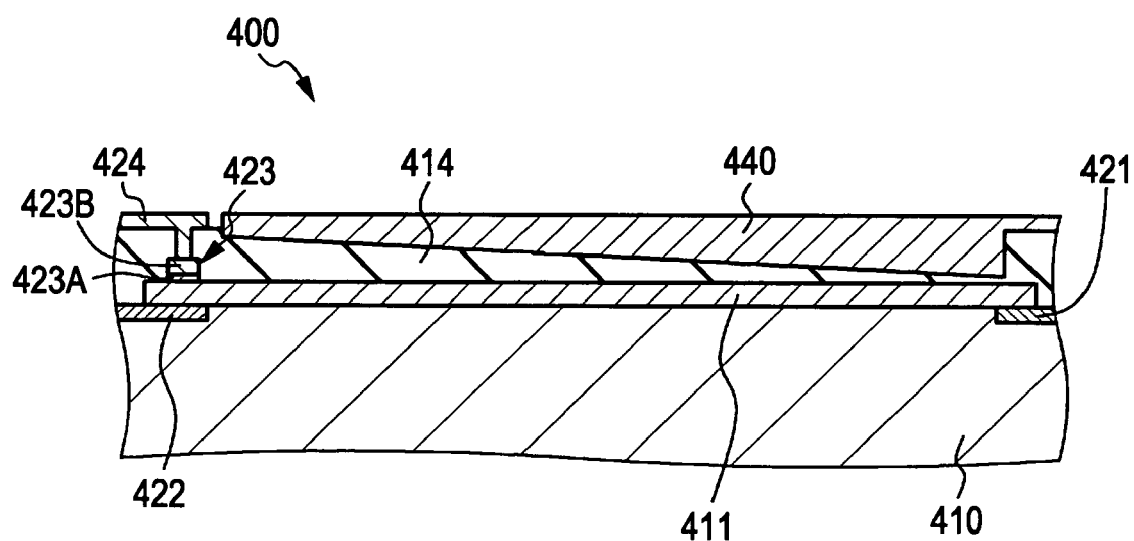
FIG. 10 is a schematic partial cross-sectional view of an information storage element of Example 4.

Example 4 is also a modification of Example 1, but relates to the third configuration. FIG. 10 is a schematic partial cross-sectional view of an information storage element 400 of Example 4. As shown in FIG. 10, a temperature control device 440 configured to change the temperature of a ferromagnetic material layer 411 in a direction of the axis of the ferromagnetic material layer 411 is disposed near the ferromagnetic material layer 411. By providing the temperature control device 440 in this manner, a temperature distribution is generated by the temperature control device 440 in a ferromagnetic material layer (ferromagnetic recording layer) 411 at the time of writing information or reading information.

As shown in the schematic partial cross-sectional view of FIG. 10, in Example 4, the temperature control device 440 is composed of a heat sink for changing the thermal conductivity of a region surrounding the ferromagnetic material layer 411. More specifically, an interlayer insulating layer 414 is provided on the ferromagnetic material layer 411. A recess is provided in a portion of the interlayer insulating layer 414, the portion being disposed on an upper portion of the ferromagnetic material layer 411. The temperature control device 440 having a strip shape and composed of a copper (Cu) layer is provided on the interlayer insulating layer 414 including the recess so as to be parallel to the ferromagnetic material layer 411. The distance from the top face of the ferromagnetic material layer 411 to the bottom face of the temperature control device 440 gradually and continuously decreases from a second end to the ferromagnetic material layer 411 toward a first end thereof. Alternatively, the distance may gradually decrease in a stepwise manner. Thus, the temperature of the ferromagnetic material layer 411 is changed in the direction of the axis of the ferromagnetic material layer 411. The regions of the ferromagnetic material layer 411 having different temperatures are divided into groups, the number of which is the number of pieces (number of bits) of information to be stored in the ferromagnetic material layer 411. Except for this point, the configuration and the structure of the information storage element 400 of Example 4 can be the same as those of the information storage element 100 of Example 1, and thus a detailed description thereof is omitted. As the temperature control device 440, instead of providing a heat sink, a heater may be provided or the ferromagnetic material layer 411 may be heated using a laser beam.

In Example 4, when a domain wall-moving current is supplied from a first electrode 421 to a second electrode 422 or when a domain wall-moving current is supplied from the second electrode 422 to the first electrode 421, Joule heat is generated inside the ferromagnetic material layer 411. Consequently, a temperature distribution in which the temperature is high at the second electrode 422 side and is low at the first electrode 421 side is generated in the ferromagnetic material layer 411 by the generated Joule heat. A method of writing information into and reading information from the information storage element of Example 4 can be substantially the same as the method of writing information into and reading information from the information storage element of Example 1, and thus a detailed description thereof is omitted.

In Example 4, as in the description in Example 1, the cross-sectional area of the ferromagnetic material layer may be varied. In addition, the configuration of the information storage element described in Example 2 may be applied to the information storage element of Example 4. Furthermore, the configuration of the information storage element described in Example 3 may be applied to the information storage element of Example 4, or a combination of the configuration of the information storage element described in Example 1 with that of the information storage element described in Example 3 may be applied to the information storage element of Example 4.

EXAMPLE 5

Example 5 relates to an information storage element according to the second embodiment of the present invention and a method of writing information into and reading information from the information storage element according to the second embodiment of the present invention.

In an information storage element 500 of Example 5, perpendicular magnetic anisotropy in a ferromagnetic material layer (ferromagnetic recording layer) 511 monotonically increases from a second end of the ferromagnetic material layer 511 to a first end thereof. In addition, a region of the ferromagnetic material layer 511 closer to a third electrode 523 has a smaller perpendicular magnetic anisotropy. In the method of writing and reading information of Example 5, at the time of writing information or reading information, the position of a domain wall in the ferromagnetic material layer 511 is controlled by increasing the temperature of the ferromagnetic material layer 511. In Example 5, the temperature of the ferromagnetic material layer 511 is increased by Joule heat generated by applying a current between a first electrode 521 and a second electrode 522. In Example 5, the value of the current applied between the first electrode 521 and the second electrode 522 is changed stepwise.

In order to monotonically increase the perpendicular magnetic anisotropy in the ferromagnetic material layer 511 from the second end of the ferromagnetic material layer 511 to the first end thereof, a composition distribution is formed by, for example, implanting ions such as Tb ions, which increase the perpendicular magnetic anisotropy, or oxygen ions or nitrogen ions, which decrease the perpendicular magnetic anisotropy, into the ferromagnetic material layer 511. In order to implant ions so that there is an ion-content gradient, for example, a shield wall-like pattern may be formed at an end of the information storage element using a photoresist or the like, and ions may then be implanted from an oblique direction using the pattern as a shield. Thus, a composition distribution can be formed. Alternatively, a distribution of the crystallinity of the ferromagnetic material layer 511 may be formed by a local heating method using a laser beam or the like. The ferromagnetic material layer 511 is composed of a material whose perpendicular magnetic anisotropy has a gradient, the material being prepared by implanting oxygen ions into TbGdFeCo from an oblique direction by the above method to form an oxygen-content distribution.

Except for the above point, the configuration and the structure of the information storage element 500 of Example 5 can be substantially the same as those of the information storage element 100 of Example 1, and thus a detailed description thereof is omitted.

A method of writing information into and reading information from the information storage element of Example 5 will now be described with reference to FIGS. 11A to 11E, FIGS. 12A to 12E, and FIGS. 13A to 13E, all of which are conceptual views of the information storage element 500. The method of writing and reading information in Example 5 is also a sequential method.

It is assumed that a value of perpendicular magnetic anisotropy of the ferromagnetic material layer 511 at a position distance $L_1$ from a second end of the ferromagnetic material layer 511 is represented by $MA_1$, a value of perpendicular magnetic anisotropy of the ferromagnetic material layer 511 at a position distance $L_2$ ($<L_1$) from the second end of the ferromagnetic material layer 511 is represented by $MA_2$ ($<MA_1$), and a value of perpendicular magnetic anisotropy of the ferromagnetic material layer 511 at a position distance $L_3$ ($<L_2$) from the second end of the ferromagnetic material layer 511 is represented by $MA_3$ ($<MA_2$). In addition, in the value $MA_1$ of the perpendicular magnetic anisotropy, when the temperature of the ferromagnetic material layer 511 is equal to or higher than $T_1°$ C., a domain wall readily moves. In the value $MA_2$ of the perpendicular magnetic anisotropy, it is assumed that when the temperature of the ferromagnetic material layer 511 is equal to or higher than $T_2°$ C. ($<T_1$), a domain wall readily moves. Furthermore, in the value $MA_3$ of the perpendicular magnetic anisotropy, it is assumed that when the temperature of the ferromagnetic material layer 511 is equal to or higher than $T_3°$ C. ($<T_2$), a domain wall readily moves.

Figure 11A:
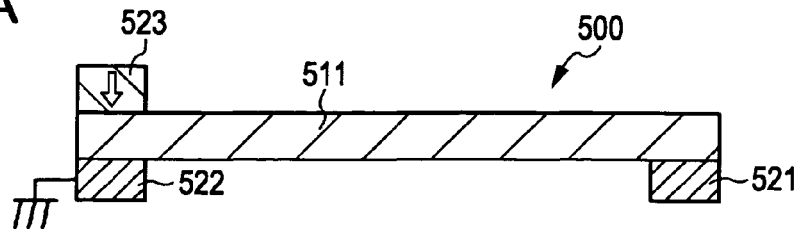
FIGS. 11A, 11B, 11C, and 11E are conceptual views of an information storage element illustrating a method of writing information into and reading information from an information storage element of Example 5.
Figure 11B:
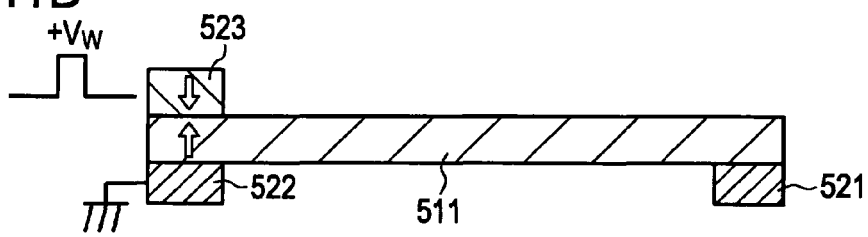

First, it is supposed that, in the state shown in FIG. 11A, information "0" is written into the ferromagnetic material layer 511 as a first bit. In this case, as shown in FIG. 11B, by applying a voltage $+V_w$ to the third electrode 523, a current is supplied from the third electrode 523 to the second electrode 522. Accordingly, information "0" (upward arrow) is written into a portion of the ferromagnetic material layer 511, the portion facing the third electrode 523.

Figure 11C:
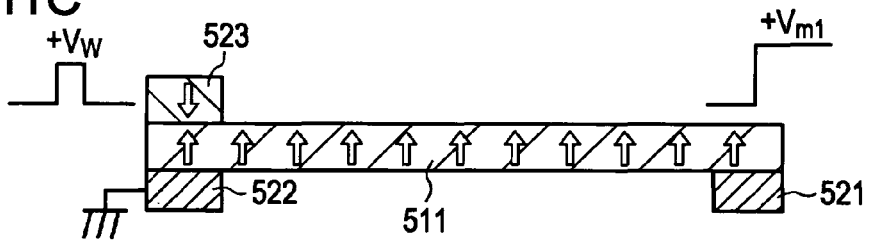
Figure 11D:
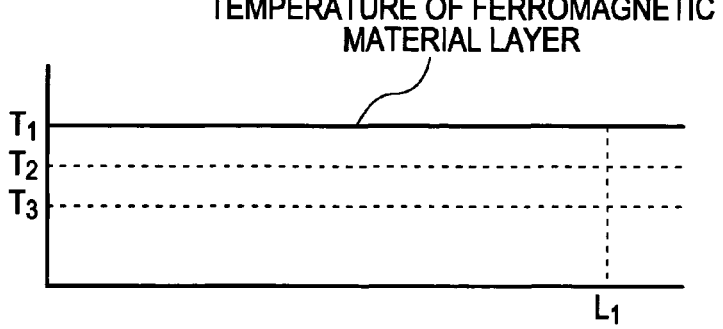
FIG. 11D is a graph that schematically shows a temperature distribution of a ferromagnetic material layer.
Figure 11E:
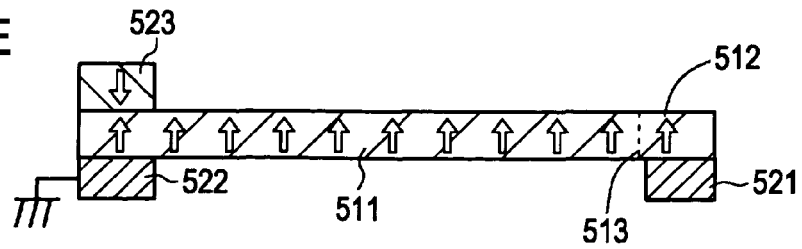

At the same time or immediately after the above application of the voltage, as shown in FIG. 11C, by applying a voltage $+V_{m1}$ to the first electrode 521, a domain wall-moving current is supplied from the first electrode 521 to the second electrode 522. Consequently, Joule heat is generated inside the ferromagnetic material layer 511, and the temperature of the ferromagnetic material layer 511 is increased to $T_1$ by the generated Joule heat (see FIG. 11D). In addition, by supplying the domain wall-moving current from the first electrode 521 to the second electrode 522, a current-induced domain wall motion occurs. Specifically, the magnetization state moves (propagates) from the left to the right. That is, a domain wall moves to the right. When the domain wall passes through the position at the distance $L_1$, the motion of the domain wall stops. The application of the voltages to the first electrode 521 and the third electrode 523 is then temporarily stopped (see FIG. 11E). Thus, information "0" is written into a region of the ferromagnetic material layer 511, the region being located beyond the position at the distance $L_1$ from the second electrode 522.

Figure 12A:
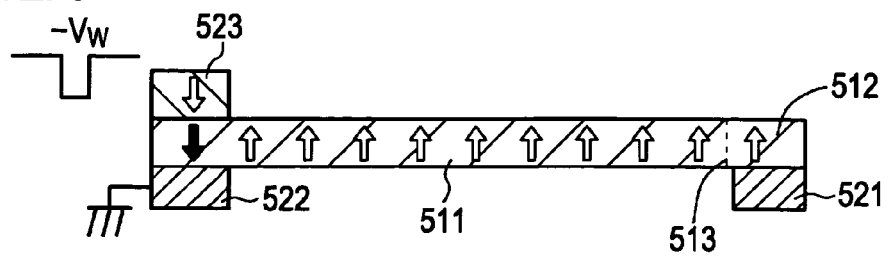
FIGS. 12A, 12B, 12D, and 12E are continuous from FIG. 11E and conceptual views of the information storage element illustrating the method of writing information into and reading information from the information storage element of Example 5.

Next, it is supposed that information "1" is written into the ferromagnetic material layer 511. In this case, as shown in FIG. 12A, by applying a voltage $-V_w$ to the third electrode 523, a current is supplied from the second electrode 522 to the third electrode 523. Accordingly, information "1" (downward arrow) is written into the portion of the ferromagnetic material layer 511 facing the third electrode 523.

Figure 12B:
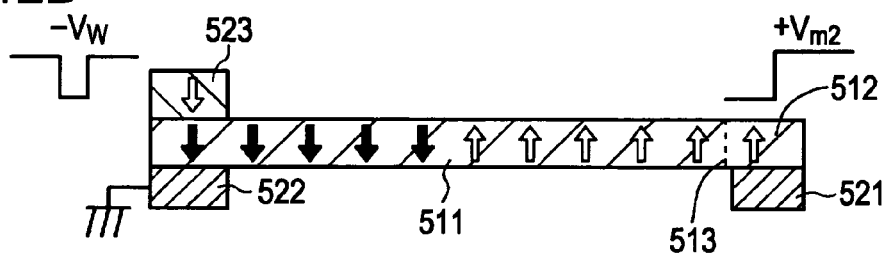
Figure 12C:
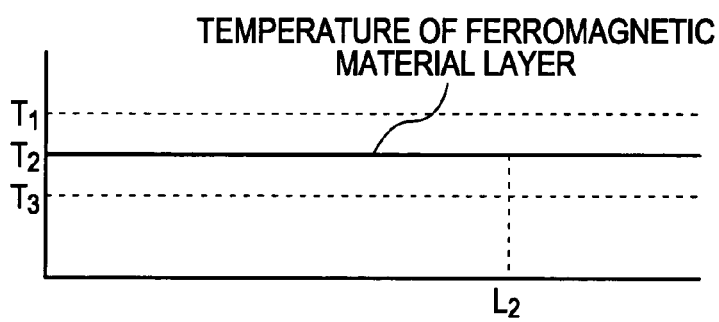
FIG. 12C is a graph that schematically shows a temperature distribution of the ferromagnetic material layer.
Figure 12D:
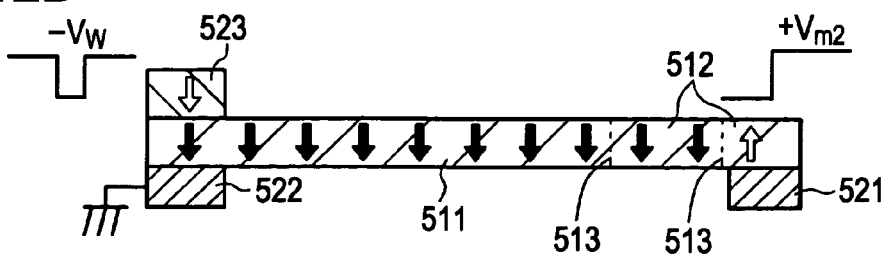
Figure 12E:
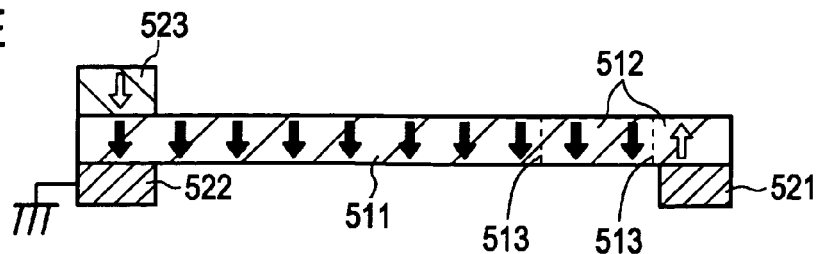

At the same time or immediately after the above application of the voltage, as shown in FIG. 12B, by applying a voltage $+V_{m2}$ ($<+V_{m1}$) to the first electrode 521, a domain wall-moving current is supplied from the first electrode 521 to the second electrode 522. Consequently, as in the case described above, the temperature of the ferromagnetic material layer 511 becomes $T_2$ by the generated Joule heat (see FIG. 12C). In addition, a current-induced domain wall motion occurs. Specifically, the magnetization state moves (propagates) from the left to the right (see FIG. 12B). That is, a domain wall moves to the right. When the domain wall passes through the position at the distance $L_2$, the motion of the domain wall stops (see FIG. 12D). The application of the voltages to the first electrode 521 and the third electrode 523 is then temporarily stopped (see FIG. 12E). Thus, information "1" is written into a region of the ferromagnetic material layer 511, the region being located beyond the position at the distance $L_2$ from the second electrode 522. That is, in this state, two pieces of information (0, 1) are written in the ferromagnetic material layer 511.

Figure 13A:
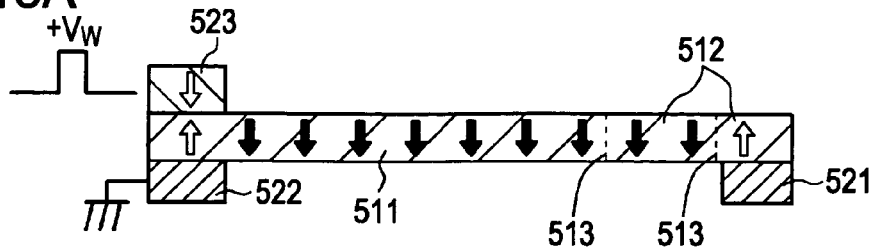
FIGS. 13A, 13B, 13D, and 13E are continuous from FIG. 12E and conceptual views of the information storage element illustrating the method of writing information into and reading information from the information storage element of Example 5.

Next, it is supposed that information "0" is written into the ferromagnetic material layer 511. In this case, as shown in FIG. 13A, by applying a voltage $+V_w$ to the third electrode 523, a current is supplied from the third electrode 523 to the second electrode 522. Accordingly, information "0" (upward arrow) is written into the portion of the ferromagnetic material layer 511 facing the third electrode 523.

Figure 13B:
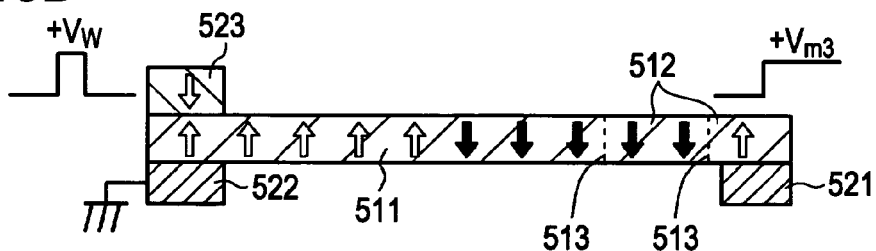
Figure 13C:
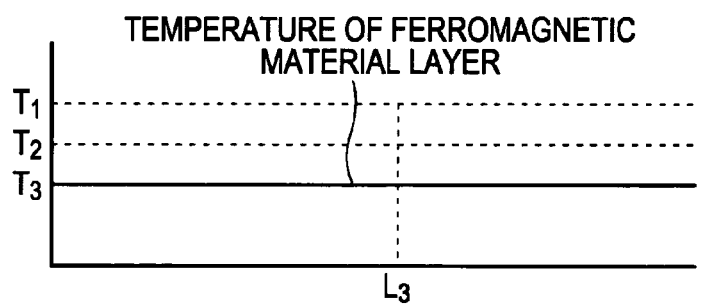
FIG. 13C is a graph that schematically shows a temperature distribution of the ferromagnetic material layer.
Figure 13D:
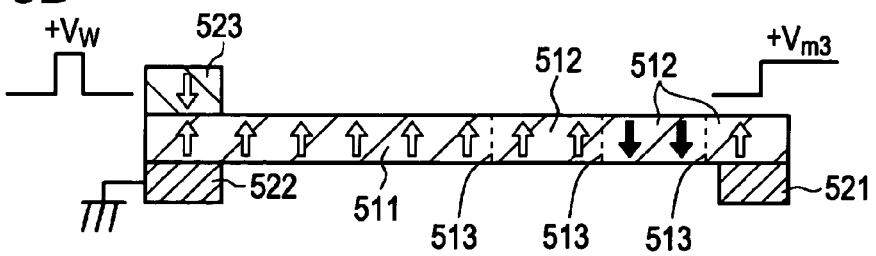
Figure 13E:
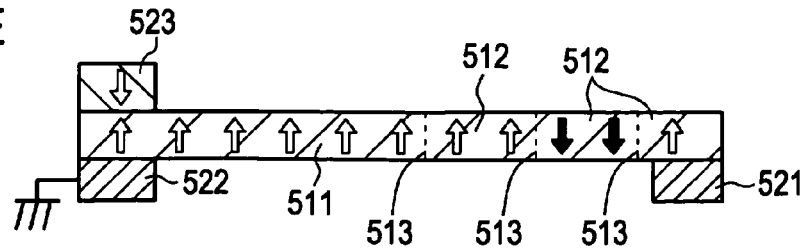

At the same time or immediately after the above application of the voltage, as shown in FIG. 13B, by applying a voltage $+V_{m3}$ ($<+V_{m2}$) to the first electrode 521, a domain wall-moving current is supplied from the first electrode 521 to the second electrode 522. Consequently, as in the case described above, the temperature of the ferromagnetic material layer 511 becomes $T_3$ by the generated Joule heat (see FIG. 13C). In addition, a current-induced domain wall motion occurs. Specifically, the magnetization state moves (propagates) from the left to the right (see FIG. 13B). That is, a domain wall moves to the right. When the domain wall passes through the position at the distance $L_3$, the motion of the domain wall stops (see FIG. 13D). The application of the voltages to the first electrode 521 and the third electrode 523 is then temporarily stopped (see FIG. 13E). Thus, information "0" is written into a region of the ferromagnetic material layer 511, the region being located beyond the position at the distance $L_3$ from the second electrode 522. That is, in this state, three pieces of information (0, 1, 0) are written in the ferromagnetic material layer 511.

Information may be sequentially written into the ferromagnetic material layer 511 by controlling the value of the domain wall-moving current while moving the domain walls 513 by supplying the domain wall-moving current from the first electrode 521 to the second electrode 522.

By successively repeating such an operation N times in total, information of N bits can be written into the ferromagnetic material layer 511.

When information written in the ferromagnetic material layer 511 is read, a domain wall-moving current is supplied from the second electrode 522 to the first electrode 521. Consequently, Joule heat is generated, thereby increasing the temperature of the ferromagnetic material layer 511 to $T_3$. In addition, a domain wall 513 moves toward the second end of the ferromagnetic material layer 511. However, the magnetization state in a region located beyond the distance $L_3$ does not move. Subsequently, a current is supplied from the third electrode 523 to the second electrode 522 to examine the level of the electrical resistance value of a magnetization region 512. Thus, whether the written information is "0" or "1" can be determined. Here, when the magnetization direction of the ferromagnetic material layer 511 is the same as that of a magnetization reference layer 523B, the electrical resistance is low. When the magnetization direction of the ferromagnetic material layer 511 is antiparallel to that of the magnetization reference layer 523B, the electrical resistance is high. Thus, the information in a region ranging from the second end of the ferromagnetic material layer 511 to a position that is located within the distance $L_3$ can be read. Next, the value of the domain wall-moving current supplied from the second electrode 522 to the first electrode 521 is increased. It is assumed that, as a result, the temperature of the ferromagnetic material layer 511 becomes $T_2$. In this state, the magnetization state as information moves toward the second end of the ferromagnetic material layer 511. However, the magnetization state in a region located beyond the distance $L_2$ does not move. Thus, the magnetization state as information at a desired position (region) in the ferromagnetic material layer 511 can be reliably read. Furthermore, the value of the domain wall-moving current supplied from the second electrode 522 to the first electrode 521 is increased. It is assumed that, as a result, the temperature of the ferromagnetic material layer 511 becomes $T_1$. In this state, the magnetization state as information moves toward the second end of the ferromagnetic material layer 511. However, the magnetization state in a region located beyond the distance $L_1$ does not move. Thus, the magnetization state as information at a desired position (region) in the ferromagnetic material layer 511 can be reliably read.

The present invention has been described on the basis of preferred Examples, but the present invention is not limited to these Examples. The configurations, the structures, the materials, and the production methods of the information storage elements described in Examples are illustrative only, and can be appropriately changed. Alternatively, as a method of reading information from a ferromagnetic material layer (ferromagnetic recording layer), a method may be employed in which information is read by detecting a direction of a magnetic field in the ferromagnetic material layer. In such a case, specific examples of a magnetic field detection device include a coil and a wiring.

Figure 14:
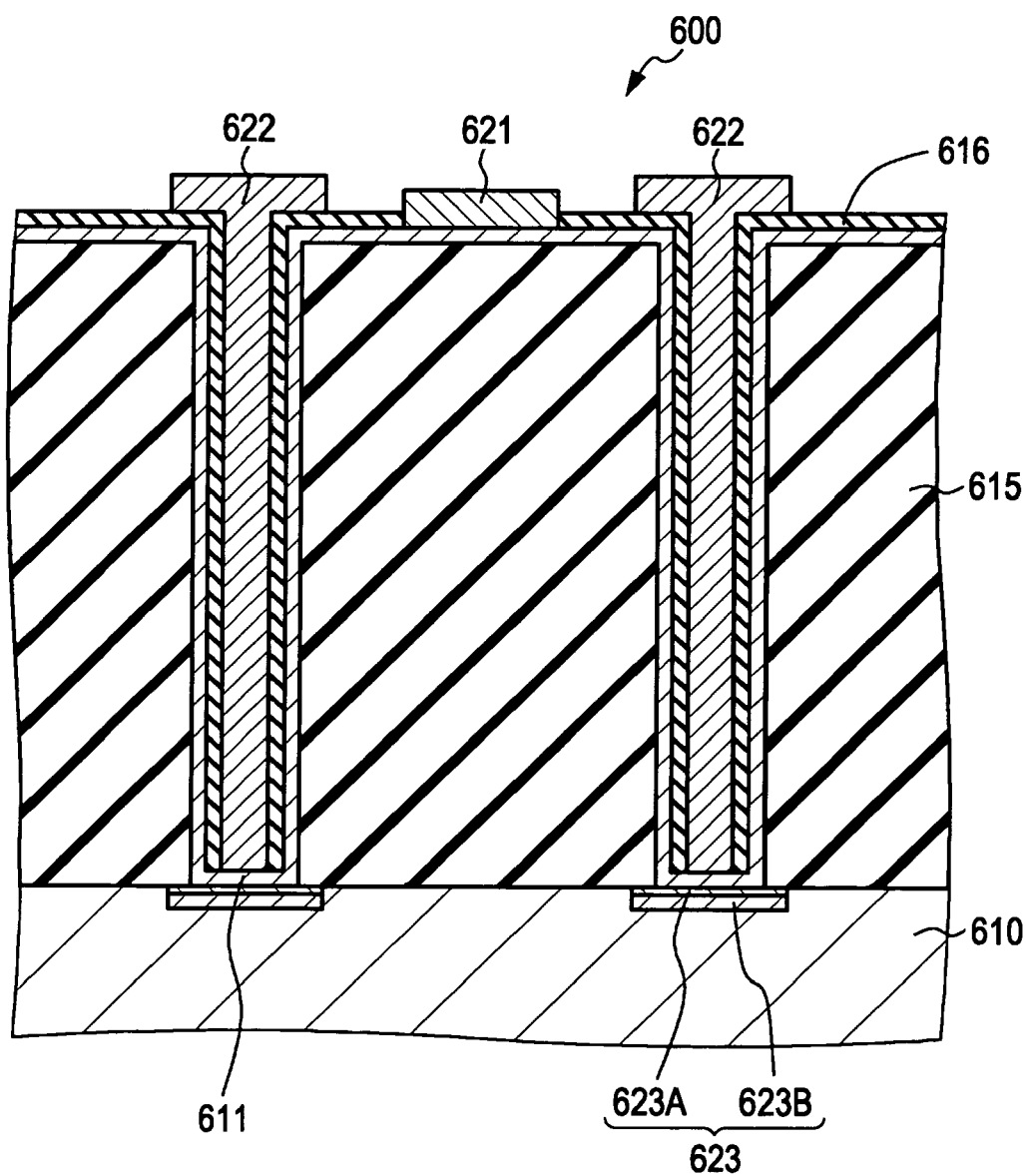
FIG. 14 is a schematic partial cross-sectional view of a modification of the information storage element of Example 1.

FIG. 14 is a schematic partial cross-sectional view of a modification of the information storage element of Example 1. As shown in FIG. 14, a strip-shaped ferromagnetic material layer (ferromagnetic recording layer) 611 in an information storage element 600 may be, for example, a U-shaped three-dimensional layer. The information storage element 600 can be produced by, for example, the following method. Specifically, third electrodes 623 each having a stacked structure including a magnetization reference layer 623B and a non-magnetic film 623A are formed in a substrate 610 composed of a silicon semiconductor substrate. Subsequently, an interlayer insulating layer 615 is formed on the substrate 610. Next, openings are formed in the interlayer insulating layer 615 located on the third electrodes 623. A ferromagnetic material layer 611 is formed in the openings, and the ferromagnetic material layer 611 is then covered with an insulating film 616. Subsequently, parts of the insulating film 616 located on the bottom of each of the openings and on the top face of the interlayer insulating layer 615 are removed. Subsequently, each of the openings is filled with a second electrode 622, and a first electrode 621 is formed on the ferromagnetic material layer 611 exposed on the top face of the interlayer insulating layer 615.

The present application contains subject matter related to that disclosed in Japanese Priority Patent Application JP 2008-269926 filed in the Japan Patent Office on Oct. 20, 2008, the entire content of which is hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. An information storage element comprising:
a strip-shaped ferromagnetic material layer;
a first electrode disposed at a first end of the ferromagnetic material layer; and
a second electrode disposed at a second end of the ferromagnetic material layer,
wherein a current-induced domain wall motion is caused by applying a current between the first electrode and the second electrode,
in the ferromagnetic material layer, a magnetization state is written into a magnetization region as information or a magnetization state is read from a magnetization region as information,
a magnetization direction in each magnetization region is parallel to a direction of the thickness of the ferromagnetic material layer, and
at the time of writing information or reading information, a temperature distribution that monotonically decreases from the second end of the ferromagnetic material layer to the first end thereof is generated in the ferromagnetic material layer.

2. The information storage element according to claim 1, further comprising:
a third electrode disposed in contact with a part of the ferromagnetic material layer, the third electrode including a non-magnetic film that is in contact with the part of the ferromagnetic material layer and a magnetization reference layer disposed on the non-magnetic film,
wherein a magnetization state is written into each magnetization region as information by applying a current between the second electrode and the third electrode.

3. The information storage element according to claim 2, wherein an electrical resistance value in each magnetization region is read from the third electrode as information by applying a current between the second electrode and the third electrode.

4. The information storage element according to claim 2, wherein, in the temperature distribution that monotonically decreases from the second end of the ferromagnetic material layer to the first end thereof, an increase in the temperature is larger in a region closer to the third electrode.

5. The information storage element according to claim 1, wherein a cross-sectional area of the ferromagnetic material layer when the ferromagnetic material layer is cut along a virtual plane orthogonal to a direction of the axis of the ferromagnetic material layer varies in the direction of the axis of the ferromagnetic material layer, and at the time of writing information or reading information, the temperature distribution is generated in the ferromagnetic material layer by applying a current between the first electrode and the second electrode.

6. The information storage element according to claim 1, wherein a specific resistance value of the ferromagnetic material layer varies in a direction of the axis of the ferromagnetic material layer, and at the time of writing information or reading information, the temperature distribution is generated in the ferromagnetic material layer by applying a current between the first electrode and the second electrode.

7. The information storage element according to claim 1, further comprising:

temperature control means for changing the temperature of the ferromagnetic material layer in a direction of the axis of the ferromagnetic material layer, the temperature control means being disposed near the ferromagnetic material layer, wherein, at the time of writing information or reading information, the temperature distribution is generated in the ferromagnetic material layer by the temperature control means.

8. An information storage element comprising:

a strip-shaped ferromagnetic material layer;

a first electrode disposed at a first end of the ferromagnetic material layer; and a second electrode disposed at a second end of the ferromagnetic material layer, wherein a current-induced domain wall motion is caused by applying a current between the first electrode and the second electrode, in the ferromagnetic material layer, a magnetization state is written into a magnetization region as information or a magnetization state is read from a magnetization region as information, a magnetization direction in each magnetization region is parallel to a direction of the thickness of the ferromagnetic material layer, and perpendicular magnetic anisotropy in the ferromagnetic material layer monotonically increases from the second end of the ferromagnetic material layer to the first end thereof.

9. The information storage element according to claim 8, further comprising:

a third electrode disposed in contact with a part of the ferromagnetic material layer, the third electrode including a non-magnetic film that is in contact with the part of the ferromagnetic material layer and a magnetization reference layer disposed on the non-magnetic film, wherein a magnetization state is written into each magnetization region as information by applying a current between the second electrode and the third electrode.

10. The information storage element according to claim 9, wherein an electrical resistance value in each magnetization region is read from the third electrode as information by applying a current between the second electrode and the third electrode.

11. The information storage element according to claim 9, wherein the perpendicular magnetic anisotropy is smaller in a region closer to the third electrode.

12. A method of writing information into and reading information from an information storage element which includes a strip-shaped ferromagnetic material layer, a first electrode disposed at a first end of the ferromagnetic material layer, and a second electrode disposed at a second end of the ferromagnetic material layer, and in which a magnetization direction in each magnetization region is parallel to a direction of the thickness of the ferromagnetic material layer, the method comprising the steps of:

applying a current between the first electrode and the second electrode to cause a current-induced domain wall motion;

in the ferromagnetic material layer, writing a magnetization state into a magnetization region as information or reading a magnetization state from a magnetization region as information; and at the time of writing information or reading information, generating a temperature distribution that monotonically decreases from the second end to the first end in the ferromagnetic material layer to control the position of a domain wall in the ferromagnetic material layer.

13. The method according to claim 12, wherein the temperature distribution is generated in the ferromagnetic material layer by Joule heat generated by applying the current between the first electrode and the second electrode.

14. The method according to claim 13, wherein the value of the current applied between the first electrode and the second electrode is changed stepwise or continuously.

15. A method of writing information into and reading information from an information storage element which includes a strip-shaped ferromagnetic material layer, a first electrode disposed at a first end of the ferromagnetic material layer, and a second electrode disposed at a second end of the ferromagnetic material layer, and in which a magnetization direction in each magnetization region is parallel to a direction of the thickness of the ferromagnetic material layer, and perpendicular magnetic anisotropy in the ferromagnetic material layer monotonically increases from the second end of the ferromagnetic material layer to the first end thereof, the method comprising the steps of:

applying a current between the first electrode and the second electrode to cause a current-induced domain wall motion;

in the ferromagnetic material layer, writing a magnetization state into a magnetization region as information or reading a magnetization state from a magnetization region as information; and at the time of writing information or reading information, increasing the temperature of the ferromagnetic material layer to control the position of a domain wall in the ferromagnetic material layer.

16. The method according to claim 15, wherein the temperature of the ferromagnetic material layer is increased by Joule heat generated by applying the current between the first electrode and the second electrode.

* * * * *